United States Patent
Shin et al.

(10) Patent No.: US 9,321,875 B2
(45) Date of Patent: *Apr. 26, 2016

(54) ADDITIVE FOR RESIST AND RESIST COMPOSITION COMPRISING SAME

(71) Applicant: KOREA KUMHO PETROCHEMICAL CO., LTD., Seoul (KR)

(72) Inventors: Jin Bong Shin, Asan-si (KR); Dong Chul Seo, Cheonan-si (KR); Hyun Soon Lim, Asan-si (KR); Joon Hee Han, Namyangju-si (KR)

(73) Assignee: KOREA KUMHO PETROCHEMICAL CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/713,779

(22) Filed: Dec. 13, 2012

(65) Prior Publication Data

US 2013/0171560 A1   Jul. 4, 2013

(30) Foreign Application Priority Data

Dec. 28, 2011   (KR) .................. 10-2011-0144926

(51) Int. Cl.
| G03F 7/004 | (2006.01) |
| G03F 7/20 | (2006.01) |
| C08F 220/22 | (2006.01) |
| C08F 301/00 | (2006.01) |
| C08F 220/18 | (2006.01) |
| C08F 220/28 | (2006.01) |
| C08F 232/08 | (2006.01) |

(52) U.S. Cl.
CPC ............ *C08F 301/00* (2013.01); *C08F 220/18* (2013.01); *C08F 220/22* (2013.01); *C08F 220/28* (2013.01); *C08F 232/08* (2013.01); *G03F 7/0046* (2013.01); *G03F 7/20* (2013.01)

(58) Field of Classification Search
CPC .... C08F 220/18; C08F 220/22; C08F 220/28; G03F 7/004; G03F 7/0046; G03F 7/20; G03F 7/2002
USPC .................. 526/245, 271, 280, 318, 319; 430/270.1, 326, 905, 910
See application file for complete search history.

(56) References Cited

U.S. PATENT DOCUMENTS

| 6,358,666 | B1 | 3/2002 | Seo et al. | |
| 6,579,659 | B2 * | 6/2003 | Uetani et al. | 430/270.1 |
| 6,639,036 | B2 | 10/2003 | Park et al. | |
| 6,866,984 | B2 * | 3/2005 | Jung et al. | 430/270.1 |
| 2001/0051742 | A1 * | 12/2001 | Hasegawa et al. | 560/116 |
| 2003/0198894 | A1 * | 10/2003 | Mizutani et al. | 430/280.1 |
| 2004/0072097 | A1 * | 4/2004 | Kodama | 430/270.1 |
| 2008/0090173 | A1 | 4/2008 | Harada et al. | |
| 2009/0081588 | A1 | 3/2009 | Hatakeyama et al. | |
| 2009/0087627 | A1 * | 4/2009 | Watanabe et al. | 428/195.1 |
| 2013/0171561 | A1 * | 7/2013 | Han et al. | 430/281.1 |

FOREIGN PATENT DOCUMENTS

| EP | 0 794 458 | * | 9/1997 |
| GB | 2 356 258 | * | 11/2000 |
| JP | 2009-300950 A | | 12/2009 |
| KR | 10-2000-0025056 A | | 5/2000 |
| KR | 10-2006-0024072 A | | 3/2006 |
| TW | 1225572 B | | 12/2004 |
| TW | 1243965 B | | 11/2005 |

OTHER PUBLICATIONS 1,1,1,3,3,3-Hexafluoroisopropyl acrylate, Chemical Book, 2010.*
Gabor et al. "Lithographic performance of alternating copolymers of norbornene and maleic anhydride with acrylate monomers," Polymeric Materials Science and Engineering (81) (1999), pp. 41-42, Aug. 22-26, 1999, New Orleans, Proceedings of Amer. Chem. Soc. Div. of Polymeric Materials: Science and Eng.
Houlihan et al., Study of Base Additives for use in a Single Layer 193 nm Resist Based Upon Poly(norbomene/maleic anhydride/acrylic acid/tert-butyl Acrylate), Journal of Photopolymer Science and Technologhy, vol. 14, No. 3 (2001) pp. 373-384.
Mao-Ching Fang et al., Abstract Advances in Resist Technology and Processing XVII (Houlihan: Santa Clara, CA, Feb. 27, 2000). Abstract, 193-nm photoresist development at Union Chemical Labs, ITRI, Conference vol. 3999.

* cited by examiner

*Primary Examiner* — Anca Eoff
(74) *Attorney, Agent, or Firm* — Birch, Stewart, Kolasch & Birch, LLP

(57) ABSTRACT

Provided are an additive for resist represented by the following formula (1), and a resist composition containing the additive. The additive according to the present invention can suppress leaching caused by water during an immersion lithographic process by increasing hydrophobicity of the surface of the resist film in the exposure at the time of applying the additive to a resist composition, and can form a fine resist pattern having excellent sensitivity and resolution at the time of applying the additive to a resist composition.

[Chemical Formula 1]

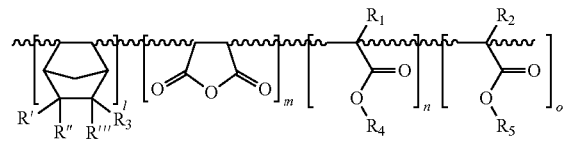

wherein the substituents respectively have the same meanings as defined above.

18 Claims, No Drawings

ADDITIVE FOR RESIST AND RESIST COMPOSITION COMPRISING SAME

BACKGROUND OF THE INVENTION

1. Field of the Invention

The present invention relates to an additive for resist which can suppress leaching caused by water at the time of an immersion lithographic process by increasing the hydrophobicity of the surface of a resist film, and can form a fine resist pattern having excellent sensitivity and resolution, and to a resist composition containing the additive for resist.

2. Description of the Related Art

Along with the recent trend of high integration of large scale integrated circuits (LSI) and an increase in the processing speed, there is a demand for fine fabrication of photoresist patterns. As the exposure light to be used at the time of forming a resist pattern, g-line (436 nm), line (365 nm), or the like of a mercury lamp has been mainly used.

However, as the increase in the resolution that stems from the exposure wavelength approaches a substantial limit, a method of making the exposure wavelength shorter has been suggested as a means for forming a finer photoresist pattern. For example, in particular, a KrF excimer laser (248 nm), an ArF excimer laser, and the like of shorter wavelengths are used instead of the i-line (365 nm).

An ArF immersion lithographic method of using an ArF excimer laser as a light source is characterized by being carried out by enclosing water between a projection lens and a wafer substrate. This method utilizes the refractive index of water at 193 nm, so that even if a lens having a numerical aperture of 1.0 or greater is used, pattern formation is possible, and this method is usually referred to as an immersion exposure method. However, there is a problem that since a resist film is brought into direct contact with pure water, the acid generated by a photoacid generator, or the amine compound that is included in the resist film as a quencher is easily dissolved in water, and thereby, a change in the shape of the resist pattern, pattern destruction caused by swelling, and various defects such as bubble defects and watermark defects occur.

Accordingly, for the purpose of blocking a resist film from a medium such as water, there has been suggested a method of forming a protective film or an upper layer film between the resist film and water. Such a resist protective film is required to have characteristics that the protective film has a sufficient light transmittance at the relevant wavelength so as not to interrupt exposure, can be formed on a resist film without causing intermixing with the resist film, can form and maintain a stable film without being dissolved out in a medium such as water at the time of immersion exposure, and can be easily dissolved in an alkali liquid or the like, which serves as a developing liquid at the time of development.

Patent Document 1: Korean Patent Application Laid-Open No. 2011-0084848 (published on Jul. 27, 2011)

Patent Document 2: Koran Patent Application Laid-Open No. 2008-0000522 (published on Jan. 2, 2008)

Patent Document 3: Korean Patent Application Laid-Open No. 2011-0079649 (published on Jul. 7, 2011)

SUMMARY OF THE INVENTION

It is an object of the present invention to provide an additive for resist which can suppress leaching by water at the time of an immersion lithographic process by increasing the hydrophobicity of the surface of a resist film, and can form a fine resist pattern having excellent sensitivity and resolution.

It is another object of the present invention to provide a resist composition containing the additive, and a method for forming a resist pattern by using the composition.

In order to achieve the objects described above, an additive for resist according to an aspect of the present invention is a copolymer represented by the following formula (1):

[Chemical Formula 1]

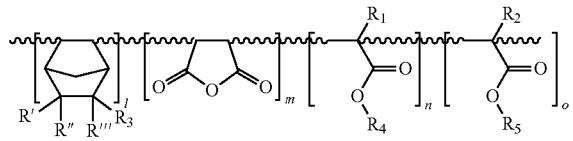

wherein in the formula (1),

R', R" and R'" each independently represent a group selected from the group consisting of a hydrogen atom, a $C_1$-$C_4$ alkyl group, a halogen atom, and a $C_1$-$C_4$ haloalkyl group in which one of the hydrogen atoms of an alkyl group is substituted by a halogen atom;

$R_1$ and $R_2$ each independently represent a hydrogen atom or a $C_1$-$C_8$ alkyl group;

$R_3$ represents a group selected from the group consisting of a hydrogen atom and functional groups represented by the following formulas (2) and (3):

[Chemical Formula 2]

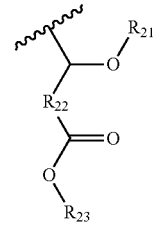

[Chemical Formula 3]

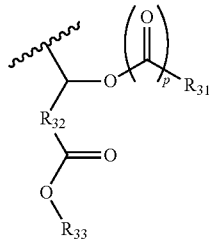

wherein in the formulas (2) and (3), $R_{21}$ represents a hydrogen atom, or a hydroxyl-protecting group selected from the group consisting of a $C_1$-$C_{20}$ alkyl group, a ($C_1$-$C_{20}$ alkoxy)alkyl group, a $C_3$-$C_{30}$ cycloalkyl group, a formyl group, a ($C_1$-$C_{20}$ alkyl)carbonyl group, a ($C_3$-$C_{30}$ cycloalkyl)carbonyl group, a ($C_1$-$C_{20}$ alkyl)carboxyl group, and a ($C_3$-$C_{30}$ cycloalkyl) carboxyl group;

$R_{31}$ represents a hydrophobic group selected from the group consisting of a $C_1$-$C_{20}$ haloalkyl group, an organosilicon group and a $C_3$-$C_{20}$ hydrocarbon group, such that if $R_{31}$ represents an organosilicon group, p represents 0, while if $R_{31}$ represents a $C_1$-$C_{20}$ haloalkyl group or a $C_3$-$C_{20}$ hydrocarbon group, p represents 1;

$R_{22}$ and $R_{32}$ each independently represent a group selected from the group consisting of a $C_1$-$C_{20}$ alkanediyl group, a $C_2$-$C_{20}$ alkenediyl group, a $C_1$-$C_{20}$ heteroalkanediyl group, a $C_2$-$C_{20}$ heteroalkenediyl group, a $C_3$-$C_{30}$ cycloalkanediyl group, a $C_3$-$C_{30}$ cycloalkenediyl group, a $C_2$-$C_{30}$ heterocycloalkanediyl group, and a $C_3$-$C_{30}$ heterocycloalkenediyl group;

$R_{23}$ and $R_{33}$ each independently represent an acid-labile group selected from the group consisting of

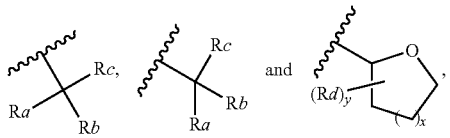

wherein $R_a$, $R_b$, $R_c$ and $R_d$ each independently represent a group selected from the group consisting of a $C_1$-$C_{20}$ alkyl group, a $C_3$-$C_{30}$ cycloalkyl group, a ($C_1$-$C_{10}$ alkyl)cycloalkyl group, a hydroxyalkyl group, a $C_1$-$C_{20}$ alkoxy group, a ($C_1$-$C_{10}$ alkoxy)alkyl group, an acetyl group, an acetylalkyl group, a carboxyl group, a ($C_1$-$C_{10}$ alkyl)carboxyl group, a ($C_3$-$C_{18}$ cycloalkyl)carboxyl group, and a $C_3$-$C_{30}$ heterocycloalkyl group, or adjacent groups may be bonded to each other to form a $C_3$-$C_{30}$ saturated or unsaturated hydrocarbon ring or a $C_2$-$C_{30}$ heterocyclic group;

x represents an integer from 0 to 3; y represents an integer from 0 to 10;

$R_4$ represents a hydrophobic group selected from the group consisting of a $C_1$-$C_{20}$ haloalkyl group, an organosilicon group, and a $C_3$-$C_{20}$ hydrocarbon group;

$R_5$ represents a group selected from the group consisting of a hydrogen atom, a $C_1$-$C_{20}$ alkyl group, a $C_2$-$C_{20}$ alkenyl group, a $C_3$-$C_{30}$ cycloalkyl group, a $C_3$-$C_{30}$ cycloalkenyl group, a $C_6$-$C_{30}$ aryl group, a $C_1$-$C_{20}$ heteroalkyl group, a $C_2$-$C_{30}$ heterocyclic group, and combinations thereof;

l, m, n and o respectively represent the proportions of corresponding repeating units in the main chain, such that l+m+n+o=1, while 0<l/(l+m+n+o)<0.9, 0.2<m/(l+m+n+o) <0.9, 0 ≤n/(l+m+n+o)<0.9, and 0≤o/(l+m+n+o)<0.9, provided that when $R_3$ represents a hydrogen atom or a functional group represented by formula (2), n is not 0; and p represents an integer of 0 or 1.

The additive for resist may be a compound in which $R_3$ represents a hydrogen atom or a functional group having a structure represented by the formula (2); l, m, n and o respectively represent the proportions of corresponding repeating units in the main chain, such that l+m+n+o=1, while 0<l/(l+m+n+o)<0.9, 0.2<m/(l+m+n+o)<0.9, 0<n/(l+m+n+o)<0.9, and 0≤o/(l+m+n+o)<0.9.

The additive for resist may be a compound in which $R_3$ represents a functional group having a structure represented by the formula (3); l, m, n and o respectively represent the proportions of corresponding repeating units in the main chain, such that l+m+n+o=1, while 0<l/(l+m+n+o)<0.9, 0.2<m/(l+m+n+o)<0.9, 0 n/(l+m+n+o)<0.9, and 0 ≤o/(l+m+n+o)<0.9.

In the formula (2), $R_{21}$ represents a group that may be selected from the group consisting of a $C_1$-$C_{10}$ alkyl group, a ($C_1$-$C_{10}$ alkoxy)alkyl group, a $C_3$-$C_{14}$ monocyclic cycloalkyl group, a $C_8$-$C_{18}$ bicyclic cycloalkyl group, a $C_{10}$-$C_{30}$ tricyclic cycloalkyl group, a $C_{10}$-$C_{30}$ tetracyclic cycloalkyl group, a formyl group, a ($C_1$-$C_{10}$ alkyl)carbonyl group, a ($C_3$-$C_{18}$ cycloalkyl)carbonyl group, a ($C_1$-$C_{10}$ alkyl)carboxyl group, and a ($C_3$-$C_{18}$ cycloalkyl)carboxyl group.

In the formula (2), $R_{21}$ represents a group that may be selected from the group consisting of a formyl group, an acetyl group, a methoxymethyl group, a t-butylcarbonyl group, a t-butyloxycarbonyl group, a cyclohexylcarbonyl group, a cyclopentylcarbonyl group, a cyclooctylcarbonyl group, an adamantylcarbonyl group, and a bicyclo[2,2,1]heptylmethylcarbonyl group.

In the formula (3), $R_{31}$ represents a group that may be selected from the group consisting of a $C_1$-$C_{10}$ fluoroalkyl group, a silyl group, a $C_1$-$C_{10}$ alkylsilyl group, a chain-like or branched $C_3$-$C_{10}$ alkyl group, a $C_3$-$C_{14}$ monocyclic cycloalkyl group, a $C_8$-$C_{18}$ bicyclic cycloalkyl group, a $C_{10}$-$C_{30}$ tricyclic cycloalkyl group, and a $C_{10}$-$C_{30}$ tetracyclic cycloalkyl group.

In the formula (3), $R_{31}$ represents a group that may be selected from the group consisting of a t-butyl group, a trifluoromethyl group, a trimethylsilyl group, a di(trifluoromethyl)isopropyl group, a pentafluoroethyl group, and a heptafluoropropyl group.

In the formulas (2) and (3), $R_{23}$ and $R_{33}$ each independently represent a group that may be selected from the group consisting of

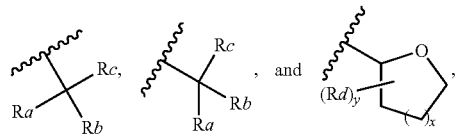

wherein $R_a$, $R_b$, $R_c$ and $R_d$ independently represent a group selected from the group consisting of a $C_1$-$C_{10}$ alkyl group, a $C_3$-$C_{14}$ monocyclic cycloalkyl group, a $C_8$-$C_{20}$ bicyclic cycloalkyl group, a $C_{10}$-$C_{30}$ tricyclic cycloalkyl group, a $C_{10}$-$C_{30}$ tetracyclic cycloalkyl group, a ($C_1$-$C_5$ alkyl)cycloalkyl group, a hydroxyalkyl group, a $C_1$-$C_{10}$ alkoxy group, a ($C_1$-$C_5$ alkoxy)alkyl group, an acetyl group, an acetylalkyl group, a carboxyl group, a ($C_1$-$C_5$ alkyl)carboxyl group, and a ($C_3$-$C_{10}$ cycloalkyl)carboxyl group, or adjacent groups may be bonded to each other to form a saturated or unsaturated $C_6$-$C_{18}$ hydrocarbon ring or a $C_5$-$C_{18}$ heterocyclic group; x represents an integer from 0 to 3; and y represents an integer from 0 to 5.

In the formulas (2) and (3), $R_{23}$ and $R_{33}$ each independently represent a group that may be selected from the group consisting of a t-butyl group, a trimethylsilyl group, a hydroxyl-2-ethyl group, a 1-methoxypropyl group, a 1-methoxy-1-methylethyl group, a 1-ethoxypropyl group, a 1-ethoxy-1-methylethyl group, 1-methoxy-1-ethyl group, a 1-ethoxy1-1-ethyl group, a t-butoxy-2-ethyl group, a 1-isobutoxy-1-ethyl group, and groups represented by the following formulas (4a) to (4k):

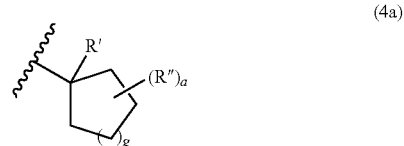

(4a)

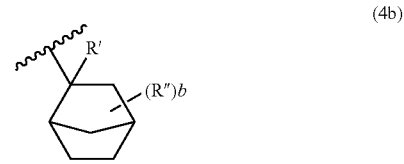

(4b)

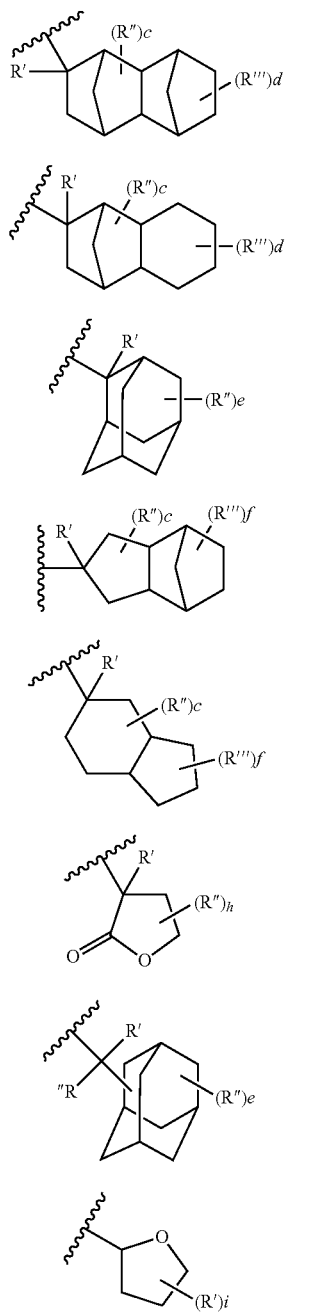

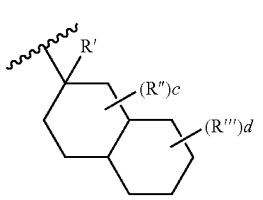

In the formulas (4a) to (4k), R′, R″ and R′″ each independently represent a hydrogen atom or a $C_1$-$C_{10}$ alkyl group; a and e each represent an integer from 0 to 15; b represents an integer from 0 to 11; c and d each independently represent an integer from 0 to 9; f represents an integer from 0 to 7; g and i each independently represent an integer from 0 to 6; h represents an integer from 0 to 4; $0 \leq c+d \leq 17$; and $0 \leq c+f \leq 15$.

In the formulas (2) and (3), $R_{23}$ and $R_{33}$ each independently represent a group that may be selected from the group consisting of moieties represented by the following formulas (5a) to (5h):

In the formula (1), $R_4$ represents a group that may be selected from the group consisting of a $C_1$-$C_{10}$ fluoroalkyl group, a silyl group, a $C_1$-$C_{10}$ alkylsilyl group, a chain-like or branched $C_3$-$C_{10}$ alkyl group, $C_3$-$C_{14}$ monocyclic cycloalkyl group, a $C_8$-$C_{18}$ bicyclic cycloalkyl group, a $C_{10}$-$C_{30}$ tricyclic cycloalkyl group, and a $C_{10}$-$C_{30}$ tetracyclic cycloalkyl group.

In the formula (1), $R_4$ represents a group that may be selected from the group consisting of a t-butyl group, a trifluoromethyl group, a trimethylsilyl group, a di(trifluoromethyl)isopropyl group, a pentafluoroethyl group, and a heptafluoropropyl group.

In the formula (1), $R_5$ represents a group that may be selected from the group consisting of a hydrogen atom, a $C_1$-$C_{10}$ alkyl group, a $C_2$-$C_{10}$ alkenyl group, a $C_3$-$C_{14}$ monocyclic cycloalkyl group, a $C_8$-$C_{18}$ bicyclic cycloalkyl group, $C_{10}$-$C_{30}$ tricyclic cycloalkyl group, a $C_{10}$-$C_{30}$ tetracyclic cycloalkyl group, a $C_3$-$C_{18}$ cycloalkenyl group, a $C_6$-$C_{18}$ aryl group, a $C_1$-$C_{20}$ heteroalkyl group, a $C_2$-$C_{18}$ heterocyclic group, and combinations thereof.

In the formula (1), $R_5$ may represent an acid-labile group selected from the group consisting of

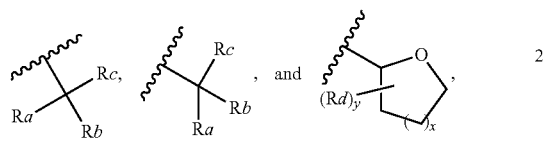

or a lactone group selected from the group consisting of

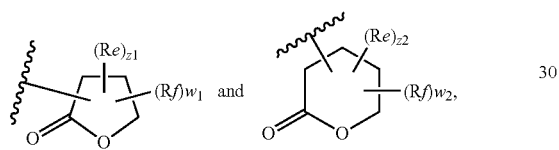

wherein $R_a$, $R_b$, $R_c$ and $R_d$ each independently represent a $C_1$-$C_{20}$ alkyl group, a $C_3$-$C_{30}$ cycloalkyl group, a ($C_1$-$C_{10}$ alkyl)cycloalkyl group, a hydroxyalkyl group, a $C_1$-$C_{20}$ alkoxy group, a ($C_1$-$C_{10}$ alkoxy)alkyl group, an acetyl group, an acetylalkyl group, a carboxyl group, a ($C_1$-$C_{10}$ alkyl)carboxyl group, a ($C_3$-$C_{18}$ cycloalkyl)carboxyl group, and a $C_3$-$C_{30}$ heterocycloalkyl group, or adjacent groups may be bonded to each other to form a saturated or unsaturated $C_3$-$C_{30}$ hydrocarbon ring or a $C_2$-$C_{30}$ heterocyclic group; $R_e$ and $R_f$ each independently represent a $C_1$-$C_{10}$ alkyl group or may be bonded to each other to form a saturated $C_3$-$C_{30}$ hydrocarbon ring; x represents an integer from 0 to 3; y represents an integer from 0 to 10; $z_1$ and $w_1$ each independently represent an integer from 0 to 3; $z_2$ and $w_2$ each independently represent an integer from 0 to 7; $0 \leq z_1+w_1 \leq 5$; and $0 \leq z_2+w_2 \leq 5$.

In the formula (1), $R_5$ represents a group that may be selected from the group consisting of a t-butyl group, a trimethylsilyl group, a hydroxyl-2-ethyl group, a 1-methoxypropyl group, a 1-methoxy-1-methylethyl group, a 1-ethoxypropyl group, a 1-ethoxy-1-methylethyl group, a 1-methoxy-1-ethyl group, a 1-ethoxy-1-ethyl group, a t-butoxy-2-ethyl group, a 1-isobutoxy-1-ethyl group, and groups represented by the following formulas (6a) to (6m):

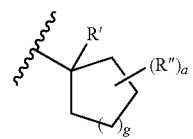
(6a)

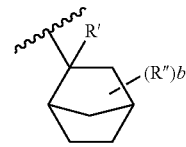
(6b)

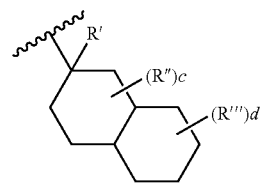
(6c)

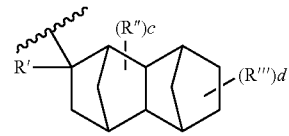
(6d)

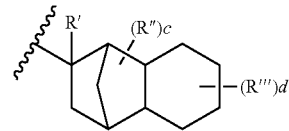
(6e)

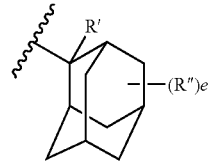
(6f)

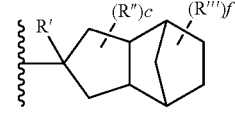
(6g)

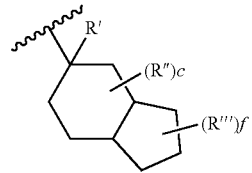
(6h)

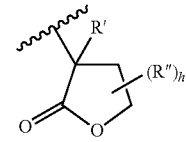
(6i)

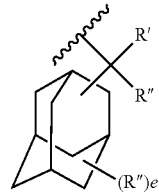
(6j)

-continued (6k) 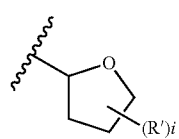

(6l) 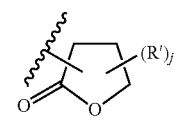

(6m) 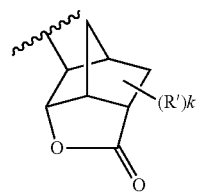

wherein in the formulas (6a) to (6m), R', R" and R'" each independently represent a hydrogen atom or a $C_1$-$C_{10}$ alkyl group; a and 3 each represent an integer from 0 to 15; b represents an integer from 0 to 11; c and d each independently represent an integer from 0 to 9; f represents an integer from 0 to 7; g, i and k each independently represent an integer from 0 to 6; h and j each independently represent an integer from 0 to 4; $0 \leq c+d \leq 17$; and $0 \leq c+f \leq 15$.

The additive for resist may be selected from the group consisting of compounds having structures represented by the following formulas (7) to (18):

[Chemical Formula 7]

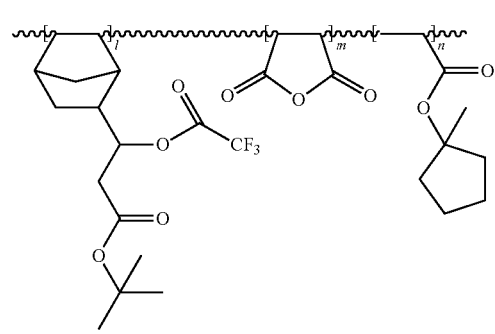

[Chemical Formula 8]

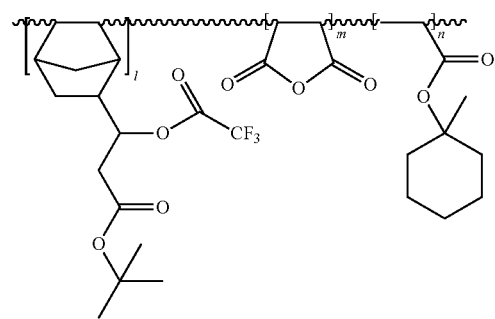

-continued

[Chemical Formula 9]

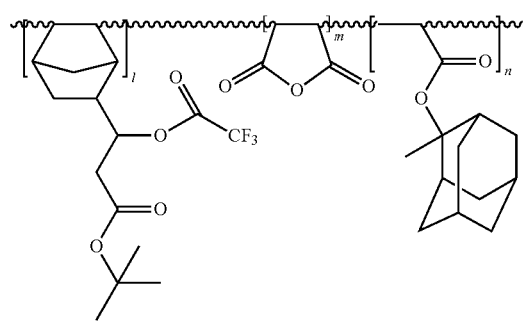

[Chemical Formula 10]

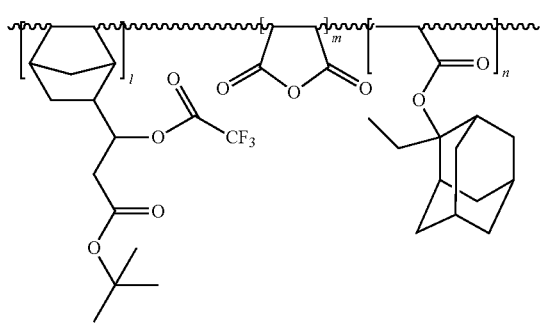

[Chemical Formula 11]

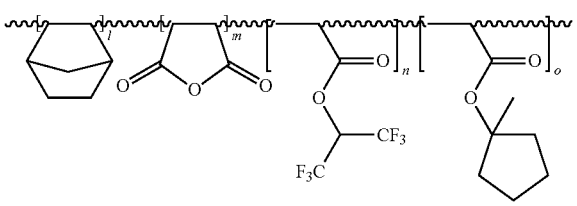

[Chemical Formula 12]

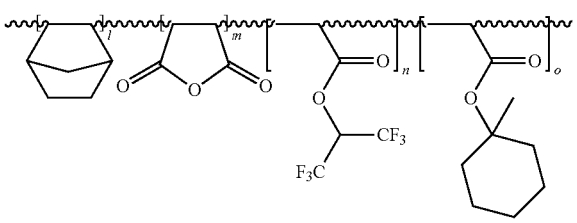

[Chemical Formula 13]

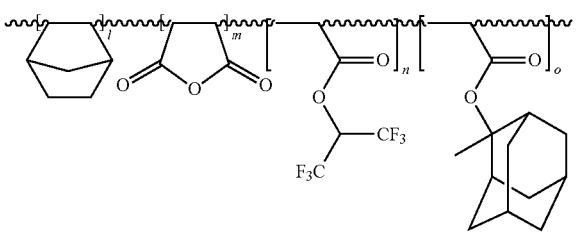

-continued

[Chemical Formula 14]

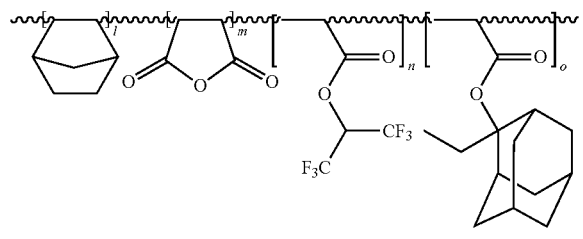

[Chemical Formula 15]

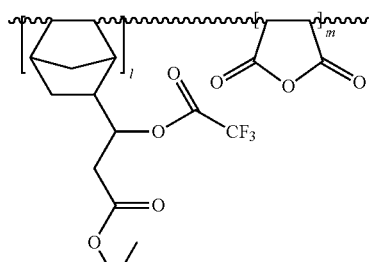

[Chemical Formula 16]

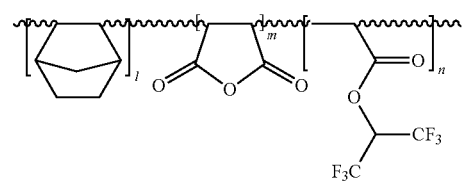

[Chemical Formula 17]

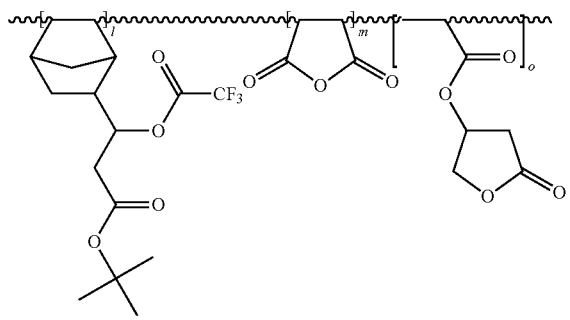

[Chemical Formula 18]

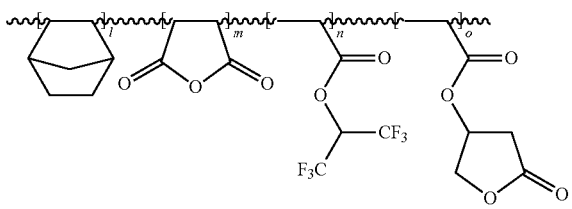

wherein in the formulas (7) to (18), l, m, n and o respectively represent the proportions of corresponding repeating units in the main chain, such that l+m+n+o=1, while 0<l/(l+m+n+o)<0.9, 0.2<m/(l+m+n+o)<0.9, 0 ≤n/(l+m+n+o)<0.9, and 0≤o/(l+m+n+o)<0.9.

In the formula (1), the repeating unit m may be included in the copolymer of the additive for resist in an amount of 30% to 60% by mole.

The additive for resist may have a weight average molecular weight as measured by gel permeation chromatography and calculated relative to polystyrene standards, of 1,000 g/mol to 50,000 g/mol.

The additive for resist may be such that the ratio of the weight average molecular weight and the number average molecular weight is 1 to 5.

A resist composition according to another aspect of the present invention includes the additive for resist according to the present invention, a base polymer for resist, an acid generator, and a solvent.

The additive for resist may be included in the resist composition in an amount of 0.05% to 5% by weight relative to the total weight of the resist composition.

The acid generator may be one or more compounds selected from the group consisting of compounds represented by the following formulas (22) and (23):

[Chemical Formula 22]

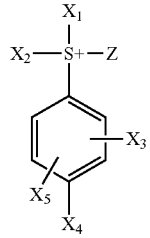

[Chemical Formula 23]

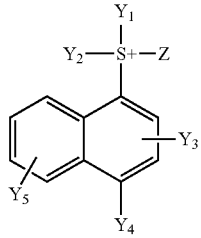

wherein in the formulas (22) and (23), $X_1$, $X_2$, $Y_1$ and $Y_2$ each independently represent any one selected from the group consisting of a $C_1$-$C_{10}$ alkyl group, an allyl group, a perfluoroalkyl group, a benzyl group, a $C_6$-$C_{30}$ aryl group, and combinations thereof; $X_1$ with $X_2$, and $Y_1$ with $Y_2$ may be bonded to each other to form a saturated or unsaturated hydrocarbon ring having 3 to 30 carbon atoms;

$X_3$, $X_4$, $X_5$, $Y_3$, $Y_4$ and $Y_5$ each independently represent any one selected from the group consisting of a hydrogen atom, a $C_1$-$C_{30}$ alkyl group, a halogen atom, a $C_1$-$C_{30}$ alkoxy group, a $C_5$-$C_{30}$ aryl group, a thiophenoxy group, a $C_1$-$C_{30}$ thioalkoxy group, a $C_1$-$C_{20}$ alkoxycarbonylmethoxy group, and combinations thereof; and Z of the anionic moiety represents $OSO_2CF_3$, $OSO_2C_4F_9$, $OSO_2C_8F_{17}$, $N(CF_3)_2$, $N(C_2F_5)_2$, $N(C_4F_9)_2$, $C(CF_3)_3$, $C(C_2F_5)_3$, $C(C_4F_9)_3$, or a functional group represented by the following formula (24):

[Chemical Formula 24]

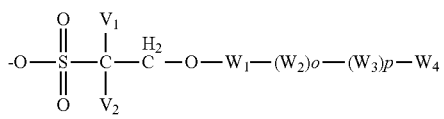

wherein in the formula (24), $V_1$ and $V_2$ each independently represent a halogen atom;

$W_1$ represents —(C=O)— or —($SO_2$)—;

$W_2$ represents a $C_1$-$C_{10}$ alkanediyl group;

$W_3$ represents any one selected from the group consisting of a $C_3$-$C_{30}$ cycloalkyl group, a $C_6$-$C_{30}$ aryl group, a $C_7$-$C_{30}$ aralkyl group, a $C_6$-$C_{30}$ aryloxy group, a $C_6$-$C_{30}$ arylthio group, and a $C_5$-$C_{30}$ heterocyclic group;

$W_4$ represents any one selected from group consisting of a hydrogen atom, a halogen atom, a $C_1$-$C_{10}$ alkyl group, a $C_1$-$C_{10}$ alkoxy group, a $C_1$-$C_{10}$ haloalkyl group, a $C_1$-$C_{10}$ alkylthio group, a $C_6$-$C_{30}$ aryl group, and combinations thereof;

o represents an integer of 0 or 1; and p represents an integer from 0 to 2.

The acid generator may be included in the resist composition in an amount of 0.3 parts to 10 parts by weight relative to 100 parts of the total solids content in the resist composition.

The resist composition may include an additive selected from the group consisting of an alkali dissolution suppressing agent, an acid diffusion suppressing agent, a surfactant, and mixtures thereof.

A method for forming a resist pattern according to another aspect of the present invention includes a step of applying the resist composition on a substrate to form a resist film; a step of heat treating the resist film and then exposing the resist film in a predetermined pattern; and a step of developing the exposed resist pattern.

The exposure step may be carried out by using a light source selected from the group consisting of a KrF excimer laser, an ArF excimer laser, an extreme ultraviolet laser, X-rays, and an electron beam.

Specific terms of other embodiments of the present invention will be described in the following detailed description of the invention.

The additive for resist according to the present invention can suppress, when applied to a resist composition, leaching caused by water during the exposure of an immersion lithographic process, by increasing the hydrophobicity of the surface of a resist film, and can form a fine resist pattern having excellent sensitivity and resolution.

DESCRIPTION OF THE PREFERRED EMBODIMENTS

Hereinafter, embodiments of the present invention will be described in detail. However, these embodiments are suggested only for illustrative purposes, and the present invention is not intended to be limited thereto. The present invention is defined only by the scope of the claims that will be described below.

Unless particularly stated otherwise, the term "halo-" or "halogen atom" as used herein refers to any one selected from the group consisting of fluorine, chlorine, bromine, and iodine.

Unless particularly stated otherwise, the prefix "hetero-" as used herein means that one to three carbon atoms are substituted by heteroatoms selected from the group consisting of nitrogen (N), oxygen (O), sulfur (S), and phosphorus (P). For example, a heteroalkyl group means a group in which one to three carbon atoms among the carbon atoms of an alkyl group are substituted by heteroatoms.

Unless particularly stated otherwise, the "alkyl group" as used herein means a linear or branched alkyl group having 1 to 30 carbon atoms, and the alkyl group includes a primary alkyl group, a secondary alkyl group, and a tertiary alkyl group. Specific examples of the alkyl group include, but are not limited to, a methyl group, an ethyl group, a propyl group, an isopropyl group, a butyl group, an isobutyl group, and a t-butyl group.

Unless particularly stated otherwise, the "cycloalkyl group" as used herein means a cycloalkyl group having 3 to 30 carbon atoms, and the cycloalkyl group includes a monocyclic group, a bicyclic group, a tricyclic group, and a tetracyclic group. Furthermore, an adamantyl group, a norbornyl group, and a polycyclic cycloalkyl group containing a norbornyl group are also included in the range of the cycloalkyl group.

Unless particularly stated otherwise, the "alkanediyl group" as used herein means a divalent atomic group obtainable by extracting two hydrogen atoms from an alkane, and may be represented by the formula: —$C_nH_{2n}$—. The "alkenediyl group" as used herein means a divalent atomic group obtainable by extracting two hydrogen atoms from an alkene, and may be represented by the formula: —$C_nH_n$—.

Unless particularly stated otherwise, the "aryl group" means a group containing a benzene ring, or a derivative thereof. Examples thereof include a group derived from toluene or xylene, in which an alkyl side chain is bonded to a benzene ring; a group derived from biphenyl, in which two or more benzene rings are linked via single bonds; a group derived from fluorene, xanthenes or anthraquinone, in which two or more benzene rings are linked via a cycloalkyl group or a heterocycloalkyl group; and a group derived from naphthalene or anthracene, in which two or more benzene rings are fused. Unless particularly stated otherwise, the aryl group as used herein means an aryl group having 6 to 30 carbon atoms.

Unless particularly stated otherwise, the "hydrocarbon group" as used herein means a monovalent hydrocarbon group which is composed of carbon and hydrogen only, and contains 3 to 20 carbon atoms. Examples of the hydrocarbon group include aliphatic chain-like and branched hydrocarbon groups, and alicyclic hydrocarbon groups. Specific examples thereof include a hexyl group, a heptyl group, an octyl group, a nonyl group, a decyl group, an undecyl group, a dodecyl group, a cyclohexyl group, a phenyl group, a tolyl group, a xylyl group, a mesityl group, a benzyl group, a diphenylmethyl group, a triphenylmethyl group, a styryl group, a biphenyl group, and a naphthyl group.

Unless particularly stated otherwise, the "heterocyclic group" as used herein means a cyclic radical having 4 to 20 ring-constituting atoms, in which one or more (for example, 1, 2, 3 or 4) carbon atoms are substituted by heteroatoms (for example, N, O, P or S). The term "heterocyclic" includes a saturated ring, a partially unsaturated ring, and an aromatic ring (that is, a heteroaromatic ring), and also includes cyclic aromatic radicals in which the heteroatoms in the ring are oxidized or quaternized, so that the compound forms, for example, an N-oxide or a quaternary salt.

A substituted heterocyclic group contains a heterocyclic ring substituted with, for example, any arbitrary substituent disclosed in the present application, including a carbonyl group.

Examples of the heterocyclic group include, but are not limited to, pyridyl, dihydropyridyl, tetrahydropyridyl (piperidyl), thiazolyl, tetrahydrothiophenyl, tetrahydrothiophenyl sulfate, pyrimidinyl, furanyl, thienyl, pyrrolyl, pyrazolyl, imidazolyl, tetrazolyl, benzofuranyl, thianaphthalenyl, indolyl, indolenyl, quinolinyl, isoquinolinyl, benzimidazolyl, piperidinyl, 4-piperidonyl, pyrrolidinyl, 2-pyrrolidonyl, pyrrolinyl, tetrahydrofuranyl, tetrahydroquinolinyl, tetrahydroisoquinolinyl, decahydroquinolinyl, octahydroisoquinolinyl, azocinyl, triazinyl, 6H-1,2,5-thiadiazinyl, 2H,6H-1,5,2-dithiazinyl, thienyl, thianthrenyl, pyranyl, isobenzofuranyl, chromenyl, xanthenyl, phenoxathinyl, 2H-pyrrolyl, isothiazolyl, isoxazolyl, pyrazinyl, pyridazinyl, indolizinyl, isoindolyl, 3H-indolyl, 1H-indazolyl, purinyl, 4H-quinolidinyl, phthalazinyl, naphthyridinyl, quinoxalinyl, quinazolinyl, cinnolinyl, pteridinyl, 4aH-carbazolyl, carbazolyl, β-carbolinyl, phenanthridinyl, acridinyl, pyrimidinyl, phenanthrolinyl, phenazinyl, phenothiazinyl, furazanyl, phenoxazinyl, isochromanyl, chromanyl, imidazolidinyl, imidazolinyl, pyrazolidinyl, pyrazolinyl, piperazinyl, indolinyl, isoindolinyl, quinuclidinyl, morpholinyl, oxazolidinyl, benzotriazolyl, benzisoxazolyl, oxindolyl, benzoxazolinyl, isatinoyl, bistetrahydrofuranyl (these may be respectively substituted or unsubstituted), and corresponding N-oxides thereof (for example, pyridyl N-oxide, and quinolinyl N-oxide), or quaternary salts thereof.

Unless particularly stated otherwise, all the compounds and substituents as used herein may be substituted or unsubstituted. Here, the term "substituted" means that a hydrogen atom is replaced with any one selected from the group consisting of a halogen atom, a hydroxyl group, a carboxyl group, a cyano group, a nitro group, an amino group, a thio group, a methylthio group, an alkoxy group, a nitrile group, an aldehyde group, an epoxy group, an ether group, an ester group, a carbonyl group, an acetal group, a ketone group, an alkyl group, a perfluoroalkyl group, a cycloalkyl group, a heterocycloalkyl group, an allyl group, a benzyl group, an aryl group, a heteroaryl group, derivatives thereof, and combinations thereof.

Furthermore, unless particularly stated otherwise, the term "combinations thereof" as used herein means that two or more substituents are linked via a single bond or a linking group, or two or more substituents are fused together.

In the case of forming a resist pattern by using a conventional ArF immersion lithographic method, the acid or amine compound contained in the resist film is dissolved in the water enclosed between a projection lens and a wafer substrate, and thereby, there occurred problems such as contamination of the projection lens, pattern destruction caused by shape change or swelling of a resist pattern, and various defective phenomena such as bubble defects or watermark defects.

In this regard, the inventors of the present invention found that fine patterns can be formed, without the occurrence of any defective phenomena, by introducing a cyclic structure composed of maleic anhydride and a norbornene derivative into the main chain of a copolymer as an additive for the photoresist composition to enhance etching resistance; introducing a hydrophobic group into a side chain of a repeating unit to increase hydrophobicity of the surface of the resist film at the time of exposure, and to suppress leaching caused by water at the time of an immersion lithographic process, while the hydrophobic group is converted to a hydrophilic group at the time of development, and exhibits solubility in a developing liquid; and introducing an acid-labile group into a side chain of a repeating unit to increase solubility in an alkali developing liquid at the time of development. Thus, the inventors of the present invention completed the present invention.

That is, the additive for resist according to an embodiment of the present invention is a multi-component copolymer represented by the following formula (1):

[Chemical Formula 1]

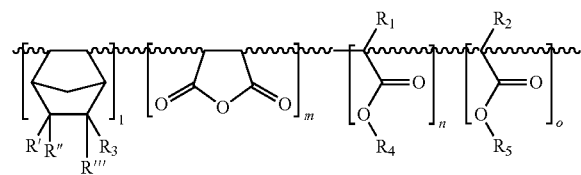

wherein in the formula (1),

R', R'' and R''' each independently represent a group selected from the group consisting of a hydrogen atom, a $C_1$-$C_4$ alkyl group, a halogen atom, and a $C_1$-$C_4$ haloalkyl group in which one of the hydrogen atoms of an alkyl group is substituted by a halogen atom;

$R_1$ and $R_2$ each independently represent a hydrogen atom or a $C_1$-$C_8$ alkyl group;

$R_3$ represents a group selected from the group consisting of a hydrogen atom and functional groups represented by the following formulas (2) and (3):

[Chemical Formula 2]

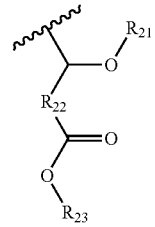

[Chemical Formula 3]

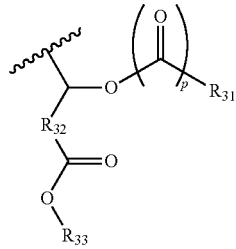

wherein in the formulas (2) and (3), $R_{21}$ represents a hydrogen atom, or a hydroxyl-protecting group selected from the group consisting of a $C_1$-$C_{20}$ alkyl group, a ($C_1$-$C_{20}$ alkoxy)alkyl group, a $C_3$-$C_{30}$ cycloalkyl group, a formyl group, a ($C_1$-$C_{20}$ alkyl)carbonyl group, a ($C_3$-$C_{30}$ cycloalkyl)carbonyl group, a ($C_1$-$C_{20}$ alkyl)carboxyl group, and a ($C_3$-$C_{30}$ cycloalkyl) carboxyl group;

$R_{31}$ represents a hydrophobic group selected from the group consisting of a $C_1$-$C_{20}$ haloalkyl group, an organosilicon group and a $C_3$-$C_{20}$ hydrocarbon group, such that if $R_{31}$ represents an organosilicon group, p represents 0, while if $R_{31}$ represents a $C_1$-$C_{20}$ haloalkyl group or a $C_3$-$C_{20}$ hydrocarbon group, p represents 1;

$R_{22}$ and $R_{32}$ each independently represent a group selected from the group consisting of a $C_1$-$C_{20}$ alkanediyl group, a $C_2$-$C_{20}$ alkenediyl group, a $C_1$-$C_{20}$ heteroalkanediyl group, a $C_2$-$C_{20}$ heteroalkenediyl group, a $C_3$-$C_{30}$ cycloalkanediyl group, a $C_3$-$C_{30}$ cycloalkenediyl group, a $C_2$-$C_{30}$ heterocycloalkanediyl group, and a $C_3$-$C_{30}$ heterocycloalkenediyl group;

$R_{23}$ and $R_{33}$ each independently represent an acid-labile group selected from the group consisting of

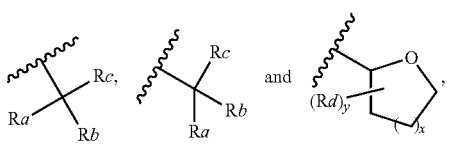

wherein $R_a$, $R_b$, $R_c$ and $R_d$ each independently represent a group selected from the group consisting of a $C_1$-$C_{20}$ alkyl group, a $C_3$-$C_{30}$ cycloalkyl group, a ($C_1$-$C_{10}$ alkyl)cycloalkyl group, a hydroxyalkyl group, a $C_1$-$C_{20}$ alkoxy group, a ($C_1$-$C_{10}$ alkoxy)alkyl group, an acetyl group, an acetylalkyl group, a carboxyl group, a ($C_1$-$C_{10}$ alkyl)carboxyl group, a ($C_3$-$C_{18}$ cycloalkyl)carboxyl group, and a $C_3$-$C_{30}$ heterocycloalkyl group, or adjacent groups may be bonded to each other to form a $C_3$-$C_{30}$ saturated or unsaturated hydrocarbon ring or a $C_2$-$C_{30}$ heterocyclic group;

x represents an integer from 0 to 3; y represents an integer from 0 to 10;

$R_4$ represents a hydrophobic group selected from the group consisting of a $C_1$-$C_{20}$ haloalkyl group, an organosilicon group, and a $C_3$-$C_{20}$ hydrocarbon group;

$R_5$ represents a group selected from the group consisting of a hydrogen atom, a $C_1$-$C_{20}$ alkyl group, a $C_2$-$C_{20}$ alkenyl group, a $C_3$-$C_{30}$ cycloalkyl group, a $C_3$-$C_{30}$ cycloalkenyl group, a $C_6$-$C_{30}$ aryl group, a $C_1$-$C_{20}$ heteroalkyl group, a $C_2$-$C_{30}$ heterocyclic group, and combinations thereof;

l, m, n and o respectively represent the proportions of corresponding repeating units in the main chain, such that l+m+n+o=1, while 0<l/(l+m+n+o)<0.9, 0.2<m/(l+m+n+o)<0.9, 0≤n/(l+m+n+o)<0.9, and 0≤o/(l+m+n+o)<0.9, provided that when $R_3$ represents a hydrogen atom or a functional group represented by formula (2), n is not 0; and p represents an integer of 0 or 1.

Specifically, in the formula (1), it is preferable that R', R" and R''' be each independently selected from the group consisting of a hydrogen atom, a methyl group, a fluoro group, and a trifluoromethyl group, and R', R" and R''' are more preferably hydrogen atoms.

In the formula (1), it is preferable that $R_1$ and $R_2$ each independently represent a hydrogen atom or a $C_1$-$C_4$ alkyl group, and more preferably a hydrogen atom or a methyl group.

In the formula (1), $R_3$ represents a hydrogen atom or a functional group having a structure represented by the above formula (2), and l, m, n and o respectively represent the proportions of corresponding repeating units in the main chain, such that l+m+n+o=1, while 0<l/(l+m+n+o)<0.9, 0.2<m/(l+m+n+o)<0.9, 0<n/(l+m+n+o)<0.9, and 0≤o/(l+m+n+o)<0.9.

Furthermore, in the formula (1), $R_3$ represents a hydrogen atom or a functional group having a structure represented by the above formula (3), and l, m, n and o respectively represent the proportions of corresponding repeating units in the main chain, such that l+m+n+o=1, while 0<l/(l+m+n+o)<0.9, 0.2<m/(l+m+n+o)<0.9, 0 ≤n/(l+m+n+o)<0.9, and 0≤o/(l+m+n+o)<0.9.

In the formula (1), when $R_3$ represents a functional group having a structure represented by the formula (2) or (3), $R_{21}$ is preferably selected from the group consisting of a $C_1$-$C_{10}$ alkyl group, a ($C_1$-$C_{10}$ alkoxy)alkyl group, a $C_3$-$C_{14}$ monocyclic cycloalkyl group, a $C_8$-$C_{18}$ bicyclic cycloalkyl group, a $C_{10}$-$C_{30}$ tricyclic cycloalkyl group, a $C_1$-$C_{30}$ tetracyclic cycloalkyl group, a formyl group, a ($C_1$-$C_{10}$ alkyl)carbonyl group, a ($C_3$-$C_{18}$ cycloalkyl)carbonyl group, a alkyl)carboxyl group, and ($C_3$-$C_{18}$ cycloalkyl)carboxyl group, and more preferably selected from the group consisting of a formyl group, an acetyl group, a methoxymethyl group, a t-butylcarbonyl group, a t-butyloxycarbonyl group, a cyclohexylcarbonyl group, a cyclopentylcarbonyl group, a cyclooctylcarbonyl group, an adamantylcarbonyl group, and a bicyclo[2,2,1]heptylmethylcarbonyl group.

Furthermore, $R_{31}$ is preferably selected from the group consisting of a $C_1$-$C_{10}$ fluoroalkyl group, a silyl group, a $C_1$-$C_{10}$ alkylsilyl group, a $C_3$-$C_{10}$ chain-like or branched alkyl group, a $C_3$-$C_{14}$ monocyclic cycloalkyl group, a $C_8$-$C_{18}$ bicyclic cycloalkyl group, a $C_{10}$-$C_{30}$ tricyclic cycloalkyl group, and a $C_{10}$-$C_{30}$ tetracyclic cycloalkyl group, and more preferably selected from the group consisting of a t-butyl group, a trifluoromethyl group, a trimethylsilyl group, a di(trifluoromethyl)isopropyl group, a pentafluoroethyl group, and a heptafluoropropyl group.

Furthermore, $R_{22}$ and $R_{32}$ are each independently preferably selected from the group consisting of a $C_1$-$C_{10}$ alkanediyl group, a $C_2$-$C_{10}$ alkenediyl group, a $C_1$-$C_{10}$ heteroalkanediyl group, a $C_2$-$C_{10}$ heteroalkenediyl group, a $C_3$-$C_{18}$ cycloalkanediyl group, a $C_3$-$C_{18}$ cycloalkenediyl group, a $C_2$-$C_{18}$ heterocycloalkanediyl group, and a $C_3$-$C_{18}$ heterocycloalkenediyl group, and more preferably selected from the group consisting of methylene, ethylidene, propylidene, trimethylene, tetramethylene, pentamethylene, hexamethylene, heptamethylene, 2,2-dimethylpentamethylene, —OCH$_2$—, —OCH(Cl)—, —CO—, —COCH$_2$—, —COCH$_2$CH$_2$—, —CH$_2$—O—CH$_2$—, —CH$_2$—O—CH$_2$CH$_2$—, —CH$_2$CH$_2$—O—CH$_2$—, —CH$_2$—O—CH$_2$CH$_2$CH$_2$—, —CH$_2$CH$_2$—O—CH$_2$CH$_2$—, —CH$_2$CH$_2$CH$_2$—O—CH$_2$—, —C(CH$_3$)$_2$CH$_2$—, —CH(CH$_3$)CH$_2$—, —CH(CH$_2$CH$_3$)—, —CH(OCH$_3$)—, —C(CF$_3$)(OCH$_3$)—, —CH$_2$—S—CH$_2$—, —CH$_2$—S—CH$_2$CH$_2$—, —CH$_2$CH$_2$—S—CH$_2$—, —CH$_2$—S—CH$_2$CH$_2$CH$_2$—, —CH$_2$CH$_2$—S—CH$_2$CH$_2$—, —CH$_2$CH$_2$CH$_2$—S—CH$_2$—, —CH(CH$_2$)CH—, —C(CH$_2$CH$_2$)—, —CH$_2$CO—, —CH$_2$CH$_2$CO—, —CH(CH$_3$)CH$_2$CO—, —CH(OH)—, —C(CH)(CH$_3$)—, —CH(F)—, —CH(Br)—, —CH(Br)CH(Br)—, —CH═CH—, —CH$_2$CH═CH—, —CH═CHCH$_2$—, —CH═CHCO—, —C$_7$H$_9$— and —C$_{10}$H$_{14}$—.

Furthermore, R23 and R33 are each independently an acid-labile group selected from the group consisting of

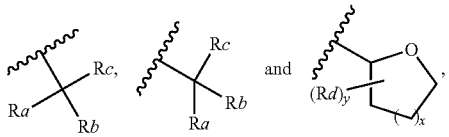

wherein $R_a$, $R_b$, $R_c$ and $R_d$ are each independently selected from the group consisting of a $C_1$-$C_{10}$ alkyl group, a $C_3$-$C_{14}$ monocyclic cycloalkyl group, a $C_8$-$C_{20}$ bicyclic cycloalkyl group, a $C_{13}$-$C_{30}$ tricyclic cycloalkyl group, a $C_{10}$-$C_{30}$ tetracyclic cycloalkyl group, a ($C_1$-$C_5$ alkyl)cycloalkyl group, a hydroxyalkyl group, a $C_1$-$C_{10}$ alkoxy group, a ($C_1$-$C_5$ alkoxy)alkyl group, an acetyl group, an acetylalkyl group, a carboxyl group, a ($C_1$-$C_5$ alkyl)carboxyl group, and a ($C_3$-$C_{10}$ cycloalkyl)carboxyl group, or adjacent groups may be bonded to each other to form a saturated or unsaturated $C_6$-$C_{15}$ hydrocarbon ring or a $C_5$-$C_{15}$ heterocyclic group. x represents an integer from 0 to 3, and y represents a integer from 0 to 5.

More preferably, $R_{23}$ and $R_{33}$ are each independently an acid-labile group selected from the group consisting of a t-butyl group, a trimethylsilyl group, a hydroxyl-2-ethyl group, a 1-methoxypropyl group, a 1-methoxy-1-methylethyl group, a 1-ethoxypropyl group, a 1-ethoxy-1-methylethyl group, a 1-methoxy-1-ethyl group, a 1-ethoxy-1-ethyl group, a t-butoxy-2-ethyl group, a 1-isobutoxy-1-ethyl group, and groups represented by the following formulas (4a) to (4k):

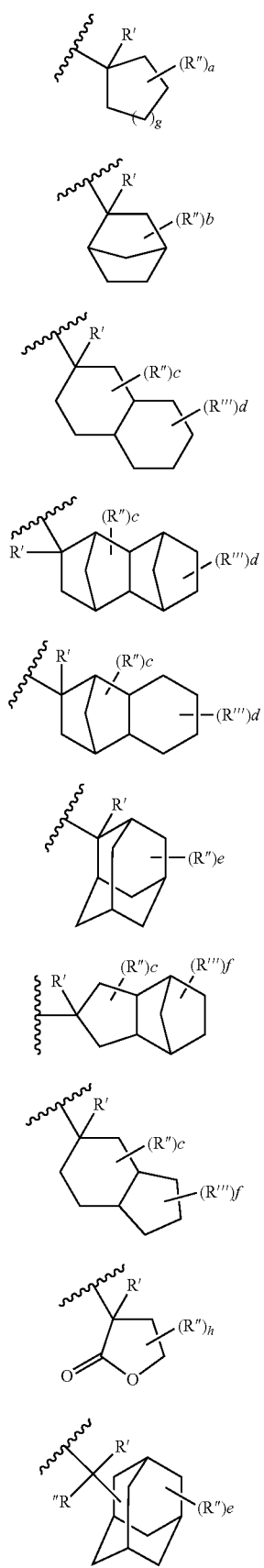

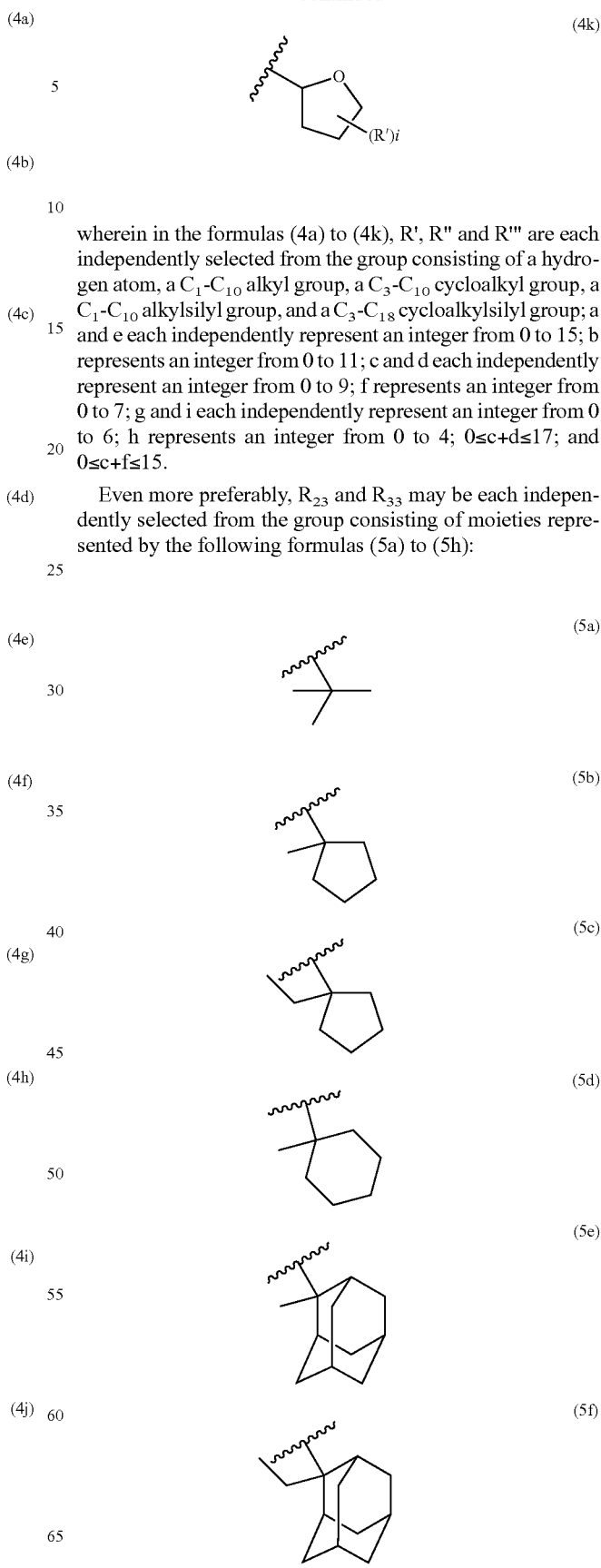

wherein in the formulas (4a) to (4k), R', R" and R'" are each independently selected from the group consisting of a hydrogen atom, a $C_1$-$C_{10}$ alkyl group, a $C_3$-$C_{10}$ cycloalkyl group, a $C_1$-$C_{10}$ alkylsilyl group, and a $C_3$-$C_{18}$ cycloalkylsilyl group; a and e each independently represent an integer from 0 to 15; b represents an integer from 0 to 11; c and d each independently represent an integer from 0 to 9; f represents an integer from 0 to 7; g and i each independently represent an integer from 0 to 6; h represents an integer from 0 to 4; $0 \leq c+d \leq 17$; and $0 \leq c+f \leq 15$.

Even more preferably, $R_{23}$ and $R_{33}$ may be each independently selected from the group consisting of moieties represented by the following formulas (5a) to (5h):

(5g)
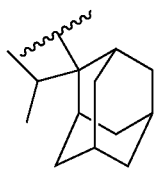

(5h)
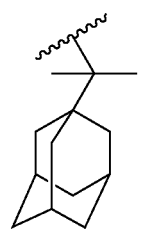

In the formula (1), $R_4$ is preferably selected from the group consisting of a $C_1$-$C_{10}$ fluoroalkyl group, a silyl group, a $C_1$-$C_{10}$ alkylsilyl group, a $C_3$-$C_{10}$ chain-like or branched alkyl group, a $C_3$-$C_{14}$ monocyclic cycloalkyl group, a $C_8$-$C_{18}$ bicyclic cycloalkyl group, a $C_{10}$-$C_{30}$ tricyclic cycloalkyl group, and a $C_{10}$-$C_{30}$ tetracyclic cycloalkyl group, and more preferably selected from the group consisting of a t-butyl group, a trifluoromethyl group, a trimethylsilyl group, a di(trifluoromethyl)isopropyl group, a pentafluoroethyl group, and a heptafluoropropyl group.

In the formula (1), $R_5$ is preferably selected from the group consisting of a hydrogen atom, a $C_1$-$C_{10}$ alkyl group, a $C_2$-$C_{10}$ alkenyl group, a $C_3$-$C_{14}$ monocyclic cycloalkyl group, a $C_8$-$C_{18}$ bicyclic cycloalkyl group, a $C_{10}$-$C_{30}$ tricyclic cycloalkyl group, $C_{10}$-$C_{30}$ tetracyclic cycloalkyl group, a $C_3$-$C_{18}$ cycloalkenyl group, a $C_6$-$C_{18}$ aryl group, a $C_1$-$C_{20}$ heteroalkyl group, a $C_2$-$C_{18}$ heterocyclic group, and combinations thereof.

More preferably, $R_5$ may be an acid-labile group selected from the group consisting of

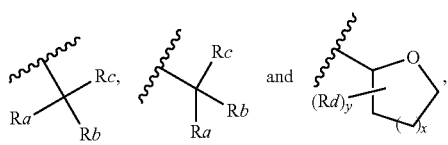

or a lactone group selected from the group consisting of

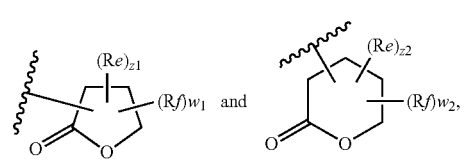

wherein $R_a$, $R_b$, $R_c$ and $R_d$ are each independently selected from the group consisting of a $C_1$-$C_{20}$ alkyl group, a $C_3$-$C_{30}$ cycloalkyl group, a ($C_1$-$C_{10}$ alkyl)cycloalkyl group, a hydroxyalkyl group, a $C_1$-$C_{20}$ alkoxy group, a ($C_1$-$C_{10}$ alkoxy)alkyl group, an acetyl group, an acetylalkyl group, a carboxyl group, a ($C_1$-$C_{10}$ alkyl)carboxyl group, a ($C_3$-$C_{18}$ cycloalkyl)carboxyl group, and a $C_3$-$C_{30}$ heterocycloalkyl group, or adjacent groups may be bonded to each other to form a saturated or unsaturated $C_3$-$C_{30}$ hydrocarbon ring or a $C_2$-$C_{30}$ heterocyclic group; $R_e$ and $R_f$ each independently represent a $C_1$-$C_{10}$ alkyl group or may be bonded to each other to form a saturated $C_3$-$C_{30}$ hydrocarbon ring; x represents an integer from 0 to 3; y represents an integer from 0 to 10; $z_1$ and $w_1$ each independently represent an integer from 0 to 3; $z_2$ and $w_2$ each independently represent an integer from 0 to 7; $0 \leq z_1 + w_1 \leq 5$; and $0 \leq z_2 + w_2 \leq 5$.

Even more preferably, $R_5$ may be selected from the group consisting of a t-butyl group, a trimethylsilyl group, a hydroxyl-2-ethyl group, a 1-methoxypropyl group, a l-methoxy-1-methylethyl group, a 1-ethoxypropyl group, a 1-ethoxy-1-methylethyl group, a 1-methoxy-1-ethyl group, a 1-ethoxy-1-ethyl group, a t-butoxy-2-ethyl group, a 1-isobutoxy-1-ethyl group, and groups represented by the following formulas (6a) to (6m):

(6a)
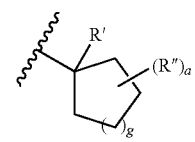

(6b)
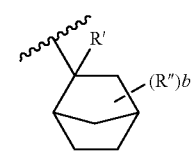

(6c)
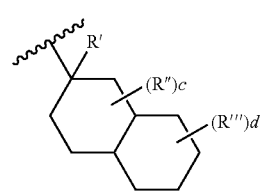

(6d)
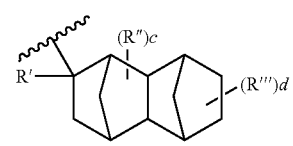

(6e)
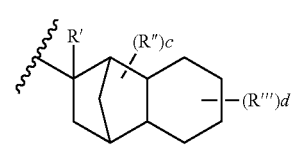

(6f)
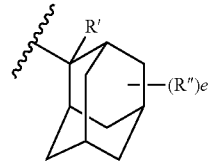

(6g)
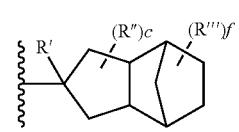

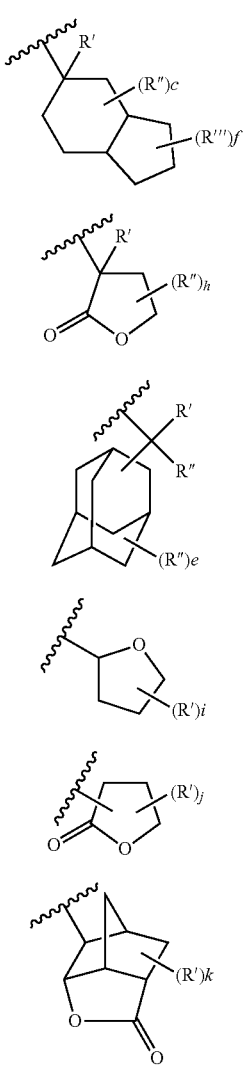

(6h)

(6i)

(6j)

(6k)

(6l)

(6m)

wherein in the formulas (6a) to (6m), R', R" and R'" each independently represent a hydrogen atom, or a $C_1$-$C_{10}$ alkyl group; a and e each independently represent an integer from 0 to 15; b represents an integer from 0 to 11; c and d each independently represent an integer from 0 to 9; f represents an integer from 0 to 7; g, i and k each independently represent an integer from 0 to 6; h and j each independently represent an integer from 0 to 4; $0 \le c+d \le 17$; and $0 \le c+f \le 15$.

When a resist film is formed by applying the additive for resist according to the present invention having a structure such as described above to a resist composition, the additive for resist is located at the surface of the resist film due to the difference in specific gravity, and increases hydrophobicity of the resist film surface. As a result, the additive for resist functions as if the additive forms a separate protective film on the surface of the resist film, and thereby prevents elution of the constituent components of the resist film into water during an immersion lithographic process. Furthermore, a resist film containing the additive for resist is dissolved in a developing solution, at both exposed areas and unexposed areas, in the developing process.

More specifically, the additive for resist according to the present invention contains a hydrophobic group in at least one of the norbornene derivative-derived repeating unit l and the acrylic derivative-derived repeating unit n, and thereby increases hydrophobicity of the surface of a resist film at the time of exposure, while suppressing leaching caused by water during a lithographic process. Furthermore, at the time of development, when the additive for resist is degassed by a developing solution, for example, trimethylammonium hydroxide (TMAH), a hydroxyl group is subsequently produced, and the additive is converted from hydrophobic to hydrophilic, so that defect generation at the surface of the resist film can be suppressed.

Furthermore, the additive for resist according to the present invention contains an acid-labile functional group in each of the norbornene derivative-derived repeating unit l and the acrylic derivative-derived repeating unit o, and thereby is converted from hydrophobic to hydrophilic by a deprotection reaction caused by an acid at an exposed area, and as a result, the additive can exhibit increased solubility in an alkali developing solution at the time of development.

Furthermore, the maleic anhydride-derived repeating unit m in the additive for resist according to the present invention is ring-opened by a developing solution at an unexposed area and forms a carboxyl group, and the repeating unit m thereby further enhances hydrophilic characteristics at the surface. As a result, a lithographic process with fewer defects is enabled.

The repeating units l, m and n that constitute the copolymer of the additive for resist according to the present invention represent the contents of the respective corresponding repeating units in the main chain, and also mean the substitution ratio by which the copolymer is dissolved in a developing solution. The additive for resist according to the present invention contains the repeating units l, m and n under the conditions that the following relationships are satisfied: $l+m+n=1$, $0<l/(l+m+n+o)<0.9$, $0.2<m/(l+m+n+o)<0.9$, $0 \le n/(l+m+n+o)<0.9$, and $0 \le o/(l+m+n+o)<0.9$. When the additive for resist contains the repeating units at the proportions described above, the additive can exhibit hydrophobicity with less affinity with water at the time of immersion exposure, and particularly, when the additive for resist contains the maleic anhydride-derived repeating unit m at a content of greater than 20% by mole, hydrophobicity is sufficiently increased as a result of ring-opening caused by the alkali solution used as a developing solution, so that the additive for resist can be easily dissolved in the developing solution. More preferably, the copolymer contains the maleic anhydride-derived repeating unit m at a content of 30% to 60% by mole.

The additive for resist according to the present invention having a structure such as described above may be a block copolymer, a random copolymer, or a graft copolymer.

Specific examples of the additive for resist according to the present invention include compounds having structures represented by the following formulas (7) to (18), and the order of the respective repeating units in the structural formulas may vary:

[Chemical Formula 7]

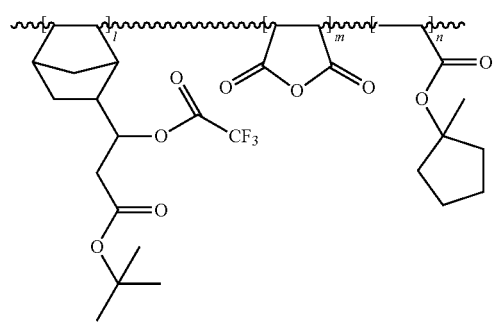

[Chemical Formula 8]
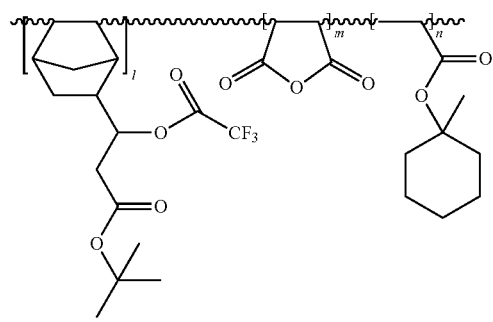
[Chemical Formula 9]
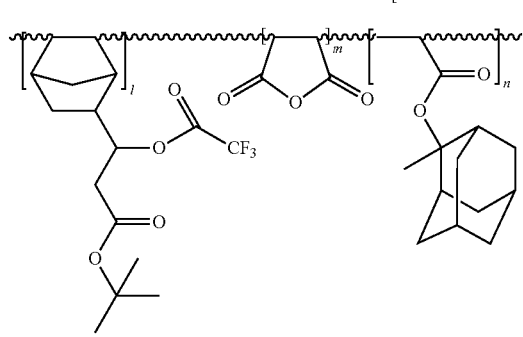
[Chemical Formula 10]
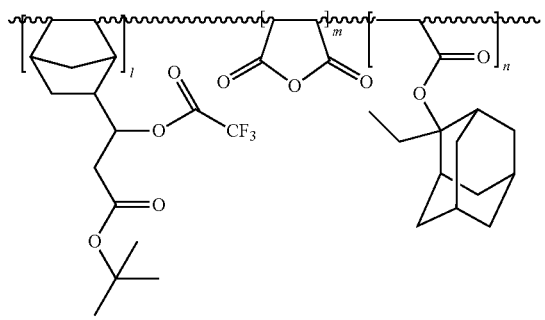
[Chemical Formula 11]
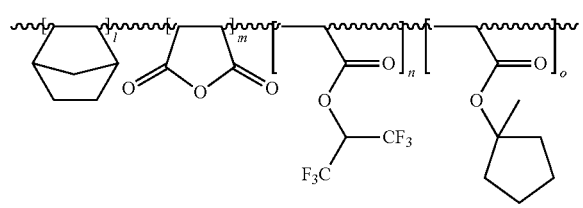
[Chemical Formula 12]
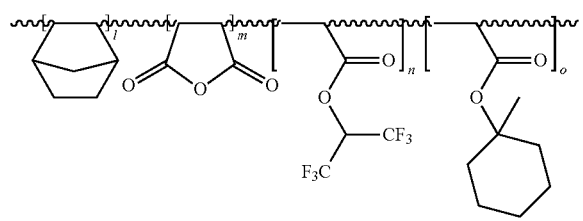
[Chemical Formula 13]
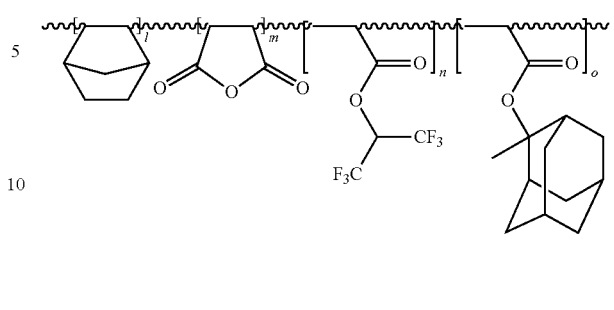
[Chemical Formula 14]
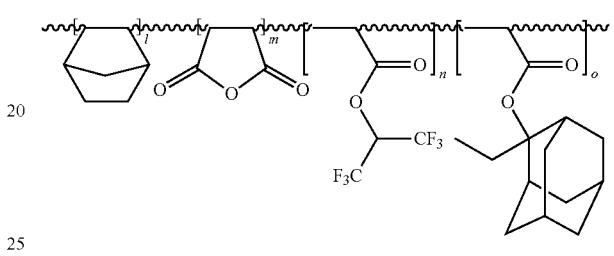
[Chemical Formula 15]
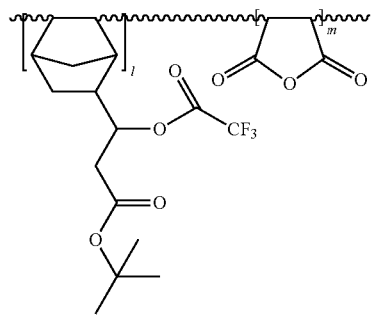
[Chemical Formula 16]
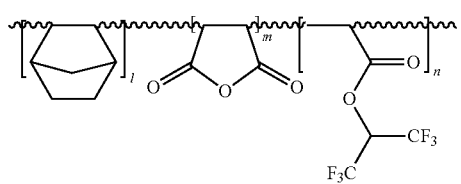
[Chemical Formula 17]
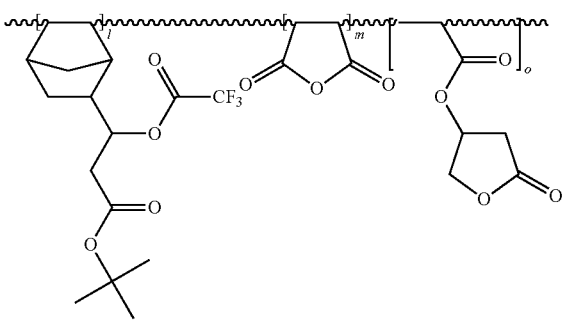

[Chemical Formula 18]

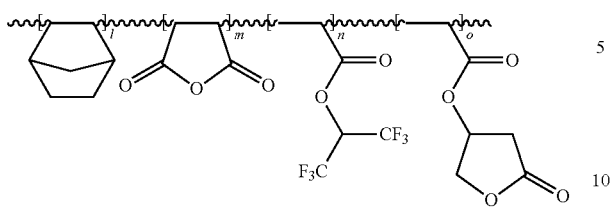

wherein in the formulas (7) to (18), l, m, n and o respectively represent the proportions of corresponding repeating units in the main chain, such that l+m+n+o=1, while 0<l/(l+m+n+o) <0.9, 0.2<m/(l+m+n+o)<0.9, 0≤n/(l+m+n+o)<0.9, and 0≤o/(l+m+n+o)<0.9.

The additive for resist according to the present invention may have a weight average molecular weight (hereinafter, referred to as "Mw") as measured by gel permeation chromatography (GPC) and calculated relative to polystyrene standards, of 1,000 g/mol to 50,000 g/mol. If the weight average molecular weight of the additive for resist is too small, intermixing may occur, or in the case of immersion exposure, elution into pure water may occur. If the weight average molecular weight is too large, appropriate film forming may not be achieved, or alkali dissolubility may be decreased. Preferably, it is preferable that the weight average molecular weight be in the range of 2,000 g/mol to 20,000 g/mol, from the viewpoint that the additive for resist can exhibit excellent solubility in developing solutions without a risk of elution into pure water.

Furthermore, the molecular weight distribution of the additive for resist, which is the ratio of the weight average molecular weight and the number average molecular weight (Mw/Mn), is preferably 1 to 5, and more preferably 1 to 3. If the molecular weight distribution of the polymer is greater than 5, the line edge roughness may be poor. Therefore, when a copolymer which satisfies the ranges of the weight average molecular weight and the molecular weight distribution is used as an additive for a photoresist composition, the photoresist composition may exhibit appropriate properties in terms of developability, coatability, and heat resistance.

The additive for resist according to the present invention having a structure such as described above can be produced by polymerizing a norbornene derivative having a structure represented by formula (19), a maleic anhydride monomer, and optionally at least one acrylic monomer selected from acrylic monomers having structures represented by formula (20) and (21), by using a conventional polymerization method, for example, bulk polymerization, solution polymerization, suspension polymerization, bulk suspension polymerization, or emulsion polymerization.

[Chemical Formula 19]

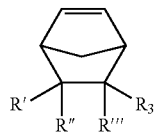

[Chemical Formula 20]

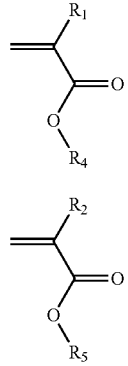

[Chemical Formula 21]

wherein in the formulas (19) to (21), R', R", R'", $R_a$, $R_b$, $R_c$, and $R_1$ to $R_5$ respectively have the same meanings as defined above.

Preferably, the additive for resist according to the present invention can be polymerization by radical polymerization, and in this case, there are no particular limitations on the radical polymerization initiator as long as a general radical polymerization initiator such as azobisisobutyronitrile (AIBN), benzoyl peroxide (BPO), lauryl peroxide, azobisisocapronitrile, azobisisovaleronitrile or t-butyl hydroperoxide, is used.

Furthermore, as the polymerization solvent, one or more kinds are selected from benzene, toluene, xylene, benzene halide, diethyl ether, tetrahydrofuran, esters, ethers, lactones, ketones, amides, and alcohols, and used.

The polymerization temperature used during the polymerization reaction is appropriately selected in accordance with the type of the catalyst. Furthermore, the molecular weight distribution of the polymer thus produced can be appropriately adjusted by varying the amount of use of the polymerization initiator and the reaction time. After polymerization is completed, it is preferable to remove any unreacted monomers and side reaction products remaining in the reaction mixture by using a solvent-induced precipitation method.

The additive for resist according to the present invention obtained according to the production methods described above and by adjusting the type and content of the monomers, has appropriate hydrophobic characteristics, so that when the additive is used in a resist composition, the resist composition is transparent to the exposure light, is not compatible with the liquid for exposure at the time of immersion exposure, and can reduce the formation of various defects that may be generated during the exposure process.

Therefore, according to another embodiment of the present invention, a resist composition containing the additive for resist described above is provided.

More specifically, the resist composition contains a base polymer for resist, an acid generator, and a solvent, in addition to the additive for resist.

The additive for resist is the same as described previously, and may be incorporated in an amount of 0.05% to 5% by weight relative to the total weight of the resist composition. If the content of the additive for resist is less than 0.05% by weight, the effect obtainable by using the additive is negligible, and if the content is greater than 5% by weight, the resolution of the resist and the roughness are decreased, which is not preferable.

There are no particular limitations on the base polymer for resist, and any base resin that is used at the time of forming a resist film can be used. Specifically, for example, any one or more selected from the group consisting of a (meth)acrylic acid ester polymer, an α-trifluoromethyl)acrylic acid ester-maleic anhydride copolymer, a cycloolefin-maleic anhydride copolymer, polynorbornene, a polymer compound obtainable by a ring-opening metathesis reaction of a cycloolefin, a polymer compound obtainable by hydrogenating a polymer obtainable by a ring-opening metathesis reaction of a cycloolefin, a derivative of hydroxystyrene and a (meth)acrylic acid ester, a polymer obtained by copolymerizing one or more of styrene, vinylnaphthalene, vinylanthracene, vinylpyrene, hydroxyvinylnaphthalene, hydroxyvinylanthracene, indene, hydroxyindene, acenaphthylene and norbornadiens, a novolac resin, and mixtures thereof, can be used.

The base polymer may be incorporated at a content of 3% to 20% by weight relative to the total weight of the resist composition. If the content of the polymer is less than 3% by weight, the viscosity of the composition becomes too low so that a film having a desired thickness cannot be formed, and there is a problem that a severe pattern loss occurs due to a relatively larger amount of the photoacid generator. If the content is greater than 20% by weight, the film thickness becomes too large, the film has poor transmission of radiations, and there is a problem that a perpendicular pattern may not be easily obtained.

As the acid generator, onium-based photoacid generators (hereinafter, referred to as "PAG") including iodonium salts, sulfonium salts, phosphonium salts, diazonium salts, pyridinium salts, and imides can be used, and preferably, one or more of sulfonium salts having structures represented by the following formulas (22) and (23) can be used. More preferably, triphenylsulfonium nonaflate can be used.

[Chemical Formula 22]

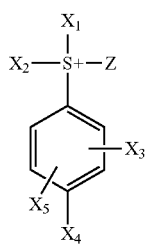

[Chemical Formula 23]

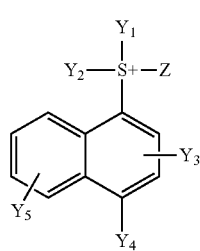

wherein in the formulas (22) and (23), $X_1$, $X_2$, $Y_1$ and $Y_2$ each independently represent any one selected from the group consisting of a hydrogen atom, a $C_1$-$C_{10}$ alkyl group, an allyl group, a $C_1$-$C_{10}$ perfluoroalkyl group, a benzyl group, a $C_6$-$C_{30}$ aryl group, and combinations thereof, and $X_1$ with $X_2$, and $Y_1$ with $Y_2$ may be bonded to each other and form a saturated or unsaturated $C_3$-$C_{30}$ hydrocarbon ring;

$X_3$, $X_4$, $X_5$, $Y_3$, $Y_4$ and $Y_5$ each independently represent any one selected from the group consisting of a hydrogen atom, a $C_1$-$C_{30}$ alkyl group, a halogen atom, a $C_1$-$C_{30}$ alkoxy group, a $C_6$-$C_{30}$ aryl group, a thiophenoxy group, a $C_1$-$C_{30}$ thioalkoxy group, a $C_1$-$C_{20}$ alkoxycarbonylmethoxy group, and combinations thereof;

Z in the anionic moiety represents $OSO_2CF_3$, $OSO_2C_4F_9$, $OSO_2C_8F_{17}$, $N(CF_3)_2$, $N(C_2F_5)_2$, $N(C_4F_9)_2$, $C(CF_3)_3$, $C(C_2F_5)_3$, $C(C_4F_9)_3$, or a functional group represented by the following formula (24):

[Chemical Formula 24]

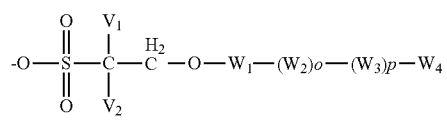

wherein in the formula (24), $V_1$ and $V_2$ each independently represent a halogen atom;

$W_1$ represents —(C=O)— or —(SO$_2$)—;

$W_2$ represents a $C_1$-$C_{10}$ alkanediyl group;

$W_3$ represents any one selected from the group consisting of a $C_3$-$C_{30}$ cycloalkyl group, a $C_6$-$C_{30}$ aryl group, a $C_7$-$C_{30}$ aralkyl group, a $C_6$-$C_{30}$ aryloxy group, a $C_6$-$C_{30}$ arylthio group, and a $C_5$-$C_{30}$ heterocyclic group;

W. represents any one selected from the group consisting of a hydrogen atom, a halogen atom, a $C_1$-$C_{10}$ alkyl group, a $C_1$-$C_{10}$ alkoxy group, a $C_1$-$C_{10}$ haloalkyl group, a $C_1$-$C_{10}$ alkylthio group, a $C_6$-$C_{30}$ aryl group, and combinations thereof;

o represents an integer of 0 or 1; and p represents an integer from 0 to 2.

When a cyclic alkyl group is incorporated into the anion for the acid generator, the acid diffusion length in the resist film is maintained to be appropriately short, high light transmissivity can be exhibited, and as a result, a resist of high resolution can be obtained.

Preferably, in the formula (24), A in the anionic moiety can be selected from the group consisting of functional groups represented by the following formulas (24a) to (24l) and (25a) to (25x):

(24a)

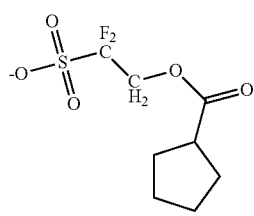

(24b)

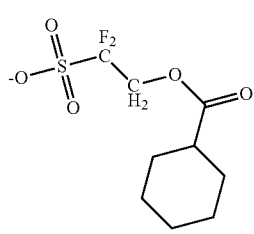

(24c) 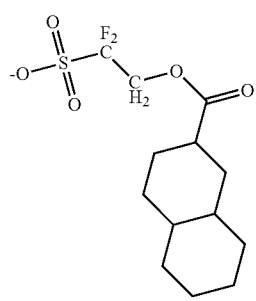
(24d) 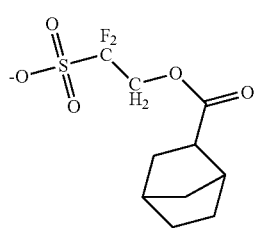
(24e) 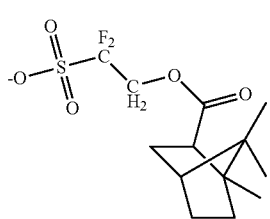
(24f) 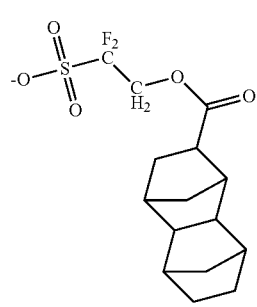
(24g) 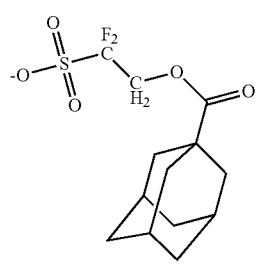
(24h) 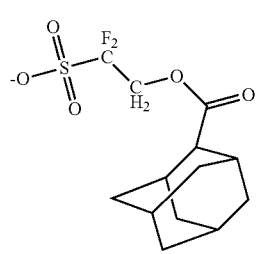
(24i) 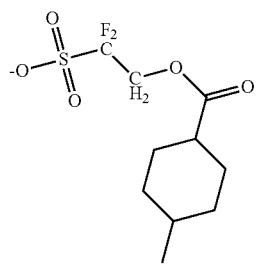
(24j) 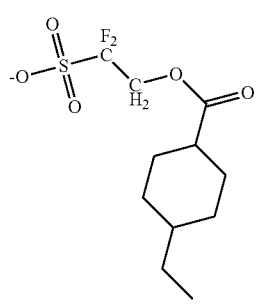
(24k) 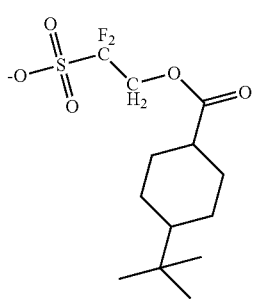
(24l) 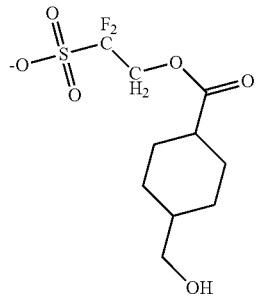
(25a) 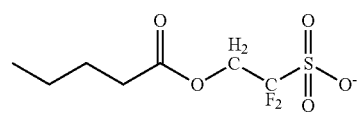
(25b) 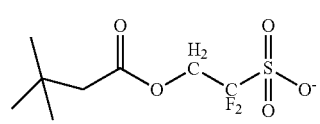
(25c) 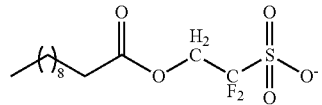

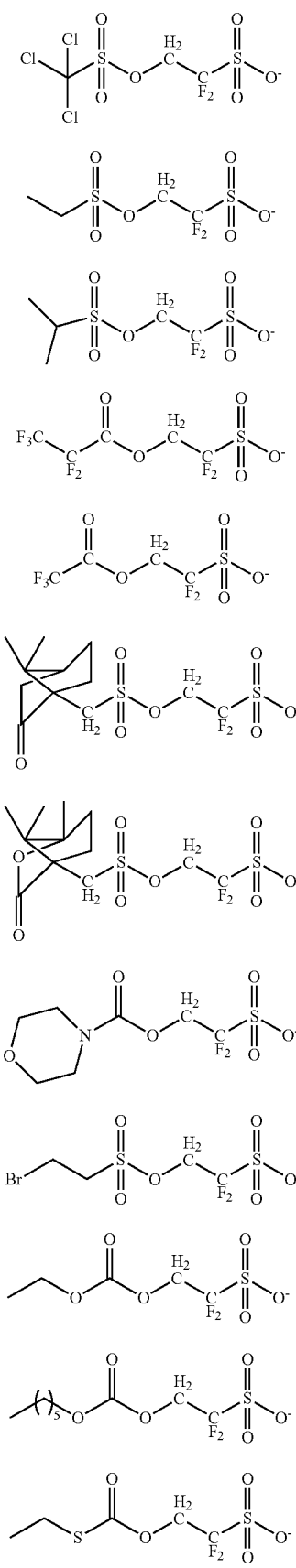
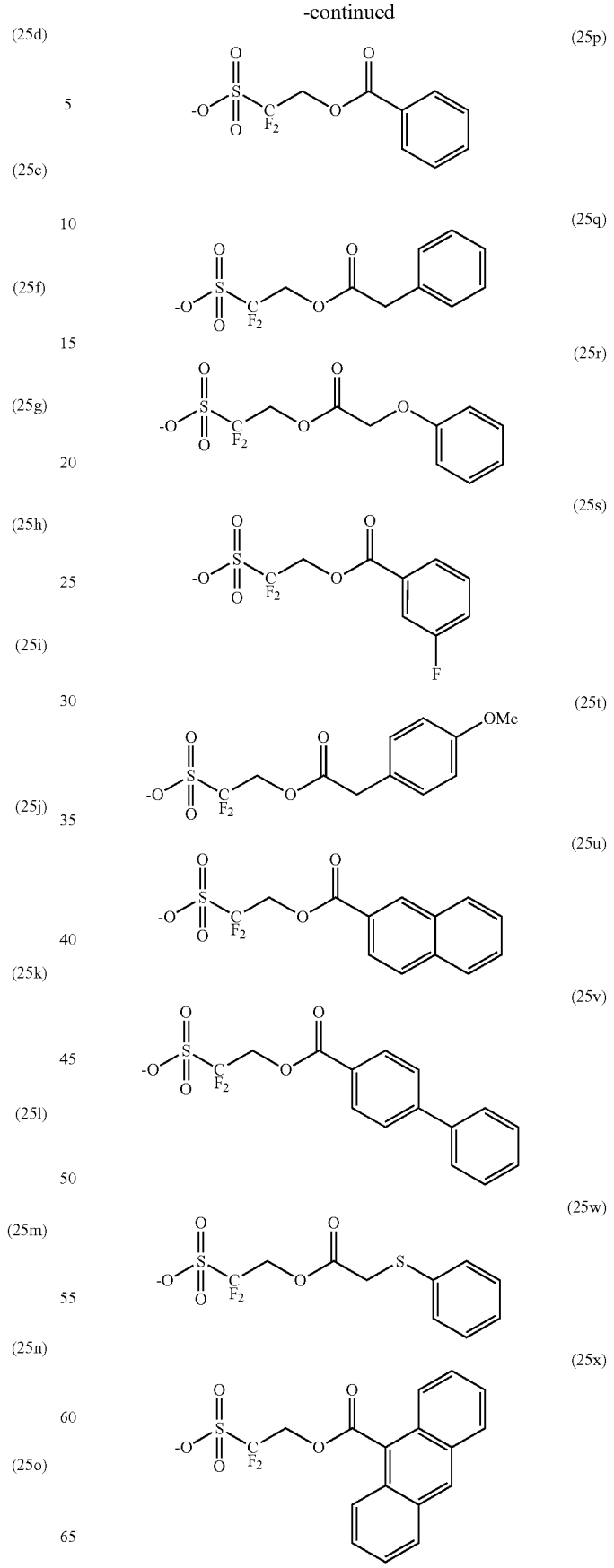

Furthermore, in the formulas (22) and (23), the cationic moiety is preferably selected from the group consisting of structures represented by the following formulas (26a) to (26p):
(26a)
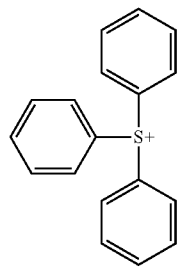
(26b)
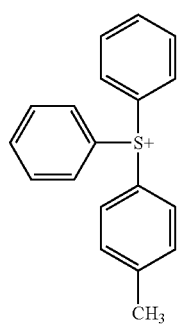
(26c)
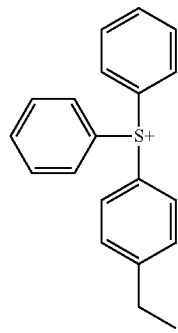
(26d)
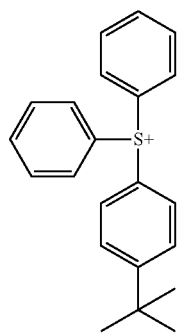
-continued
(26e)
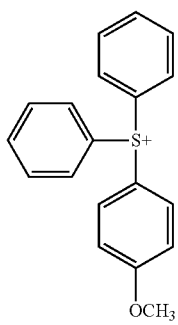
(26f)
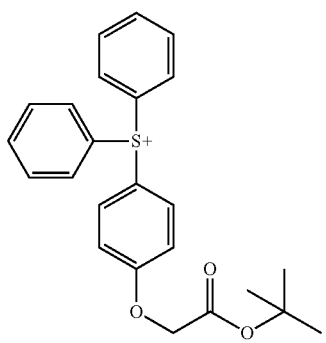
(26g)
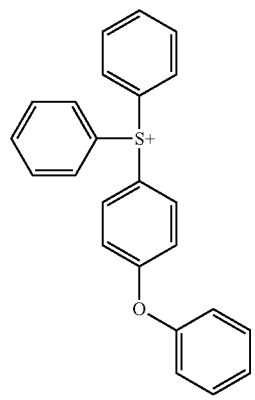
(26h)
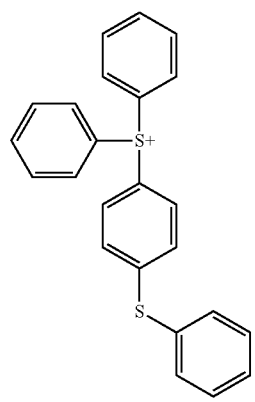

(26i) 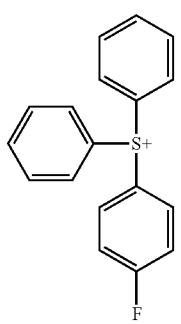

(26j) 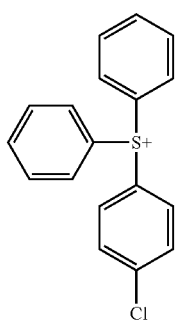

(26k) 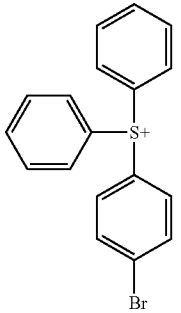

(26l) 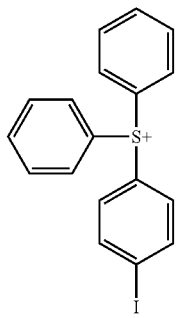

(26m) 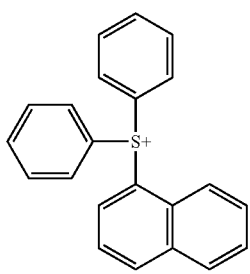

(26n) 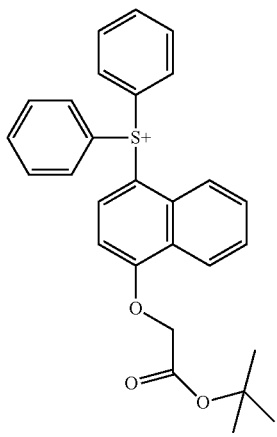

(26o) 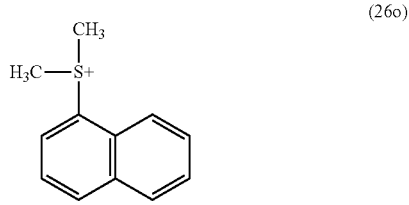

(26p) 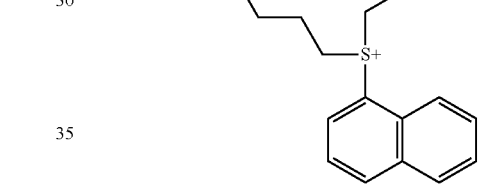

The acid generator such as described above can be used singly, or as mixtures of two or more kinds. Furthermore, the acid generator may be incorporated in an amount of 0.3 parts to 15 parts by weight, preferably 0.5 parts to 10 parts by weight, and more preferably 2 parts to 10 parts by weight, relative to 100 parts by weight of the total solids content of the polymer. If the content of the acid generator is greater than 15 parts by weight, perpendicularity of the pattern is markedly deteriorated, and if the content is less than 0.3 parts by weight, there is a risk that bendability of the pattern may decrease.

In order to obtain a uniform and flat resist coating film, it is preferable to use a solution obtained by dissolving the polymer and the acid generator in a solvent having an appropriate evaporation rate and appropriate viscosity. Examples of the solvent that can be used in the present invention include ethylene glycol monomethyl ether, ethylene glycol monoethyl ether, ethylene glycol monopropyl ether; esters such as methylcellosolve acetate, ethylcellosolve acetate, propylene glycol monomethyl ether acetate, propylene glycol monoethyl ether acetate, and propylene glycol monopropyl ether acetate; and ketones such as methyl isopropyl ketone, cyclohexanone, methyl 2-hydroxypropionate, ethyl 2-hydroxypropionate, 2-heptanone, ethyl lactate, and γ-butyrolactone. These solvents can be used singly or as mixtures of two or more kinds.

With regard to the solvent, the amount of use thereof can be appropriately adjusted in accordance with the properties of the solvent, that is, volatility, viscosity and the like, so that a uniform resist film can be formed.

Furthermore, the resist composition according to the present invention can further include other additives according to the purpose such as an increase in coatability.

There are no particular limitations on the other additives as long as they are conventionally applied to a resist composition, and specific examples thereof include an alkali dissolution suppressing agent, an acid diffusion suppressing agent, and a surfactant. One kind only, or a mixture of two or more kinds of these may be incorporated into the resist composition.

Any alkali dissolution suppressing agent that is conventionally applied to a resist composition can be used as the alkali dissolution suppressing agent, and specific examples thereof include phenol and carboxylic acid derivatives.

The acid diffusion suppressing agent has a function of controlling the diffusion phenomenon occurring when the acid generated from the acid generator as a result of light irradiation diffuses into the resist film, and suppressing any chemical reaction in an unexposed area. When such an acid diffusion suppressing agent is used, storage stability of a radiation-sensitive resin composition can be increased, resolution of the resist can be further improved, and the change in the line width in the resist pattern caused by a fluctuation in the time taken from exposure to development (PED) can be suppressed.

As such an acid diffusion suppressing agent, a basic compound can be used, and specific examples thereof include ammonia, amines such as methylamine, isopropylamine, n-hexylamine, cyclopentylamine, methylenediamine, ethylenediamine, dimethylamine, diisopropylamine, diethylenediamine, N,N-dimethylmethylenediamine, N,N-dimethylethylenediamine, trimethylamine, triethylamine, N,N,N',N'-tetramethylmethylenediamine, N,N,N',N'-tetramethylethylenediamine, N,N,N',N'-tetramethyltetrethylenepentamine, dimethylethylamine, methylethylpropylamine, benzylamine, phenethylamine, benzyldimethylamine, tetramthylammonium hydroxide, aniline, N,N-dimethyltoluidine triphenylamine, phenylenediamine, pyrrole, oxazole, isoxazole, thiazole, isothiazole, imidazole, pyrazole, pyrroline, pyrrolidine, imidazoline derivatives, imidazolidine derivatives, pyridine derivatives, pyridazine derivatives, pyrimidine derivatives, pyrazine derivatives, pyrazoline derivatives, pyrazolidine derivatives, piperidine derivatives, piperazine derivatives, and morpholine; nitrogen-containing compounds such as aminobenzoic acid, indolecarboxylic acid, amino acid derivatives (for example, nicotinic acid, alanine, arginine, and aspartic acid), 3-pyridinesulfonic acid, pyridinium p-toluenesulfonate, 2-hydroxypyridine, aminocresol, 2,4-quinolinediol, 2-(2-hydroxyethyl)pyridine, and 1-(2-hydroxyethyl)piperazine; amide derivatives such as formamide, N-methylformamide, N,N-dimethylformamide, acetamide, N-methylacetamide, N,N-dimethylacetamide, propionamide, and benzamide; and imide derivatives such as phthalimide, succinimide, and maleimide.

The acid diffusion suppressing agent may be incorporated in an amount of 0.01 parts to 5 parts by weight, and preferably 0.1 parts to 1 part by weight, relative to 100 parts by weight of the solids content of the polymer. If the content of the acid diffusion suppressing agent is less than 0.01 parts by weight, the influence of the acid diffusion suppressing agent increases with the retention time after exposure, and there is a risk that the shape of the pattern may be affected. If the content is greater than 5 parts by weight, there is a risk that resolution and sensitivity may be decreased.

The surfactant is intended to improve coatability, developability and the like, and specific examples thereof include, but are not limited to, polyoxyethylene lauryl ether, polyoxyethylene stearyl ether, polyoxyethylene, and polyethylene glycol dilaurate.

The resist composition according to the present invention having a composition such as described above can be dissolved in a developing solution at exposed areas and unexposed areas during the development process after irradiation with an ArF light source, exhibits an improved line width roughness, and exhibits excellent resolution in both C/H patterns and L/S patterns. Furthermore, the resist composition exhibits an excellent process window so that excellent pattern profiles can be obtained regardless of the type of the substrate, and exhibits improved contrast. Accordingly, the resist composition is useful as a positive type chemically amplified photoresist composition which responds to radiation such as far-ultraviolet radiation such as KrF excimer laser light, ArF excimer laser light, or $F_2$ excimer laser light; X-radiation such as synchrotron radiation; and charged particle radiation such as extreme ultraviolet (EUV).

According to another embodiment of the present invention, a pattern forming method by using the resist composition is provided.

Specifically, the pattern forming method includes a step of applying the resist composition on a substrate and thereby forming a resist film; a step of heat treating the resist film and then exposing the resist film into a predetermined pattern; and a step of developing the exposed resist pattern.

As the substrate, a wafer substrate can be used, and as the method for coating a substrate, methods such as flow casting or roll coating can be used.

Specifically, the resist composition is applied on a substrate such as a silicon wafer to a film thickness of 0.3 µm to 2.0 µm, and this film is prebaked for 1 minute to 10 minutes at 60° C. to 150° C., and preferably for 5 minutes at 80° C. to 130° C.

Subsequently, the resist film is partially irradiated with radiation in order to form a fine pattern. The radiation that can be used at this time is not particularly limited, but ultraviolet radiation such as I-line; far-ultraviolet radiation such as KrF excimer laser light, ArF excimer laser light, or $F_2$ excimer laser light; X-radiation; and charged particle radiation such as an electron beam can be used. The radiation can be appropriately selected for use in accordance with the type of the acid generator.

Specifically, radiation is irradiated at a dose of about 1 mJ/cm$^2$ to 200 mJ/cm$^2$, and preferably about 10 mJ/cm$^2$ to 100 mJ/cm$^2$, and then the resist film is subjected to post-exposure baking (PEB) for 1 to 5 minutes at 60° C. to 150° C., and preferably for 1 to 3 minutes at 80° C. to 130° C.

After the exposure process, the exposed resist pattern is developed by using a developing solution for 0.1 to 3 minutes, and preferably for 0.5 to 2 minutes, by a conventional method such as a dipping method, a paddle method or a spray method, and thereby a desired pattern is formed on the substrate. Regarding the developing solution that can be used in this case, an aqueous solution containing sodium hydroxide, potassium hydroxide, sodium carbonate, sodium silicate, sodium methanesilicate, ammonia, ethylamine, n-propylamine, triethylamine, tetramethylammonium hydroxide, tetraethylammonium hydroxide, or the like can be used, and preferably, tetramethylammonium hydroxide may be used.

Furthermore, the developing solution may optionally include other additives such as a surfactant or a water-soluble alcohol.

As discussed above, a fine resist pattern having excellent sensitivity and resolution can be formed by the pattern forming method using the resist composition according to the present invention.

Hereinafter, Examples of the present invention will be described in detail so that a person having ordinary skill in the art to which the present invention is pertained, can easily carry out the present invention. However, the present invention can be realized in various different forms, and is not intended to be limited to the Examples described herein.

EXAMPLES

Production Example

Synthesis of Monomer and Polymer

Synthesis Example for Monomer 1

Synthesis of 3-bicyclo[2.2.1]hept-5-en-2-yl-3-(2,2,2-trifluoroacetoxy)propionic acid tert-butyl ester (hereinafter, referred to BHP-5) monomer

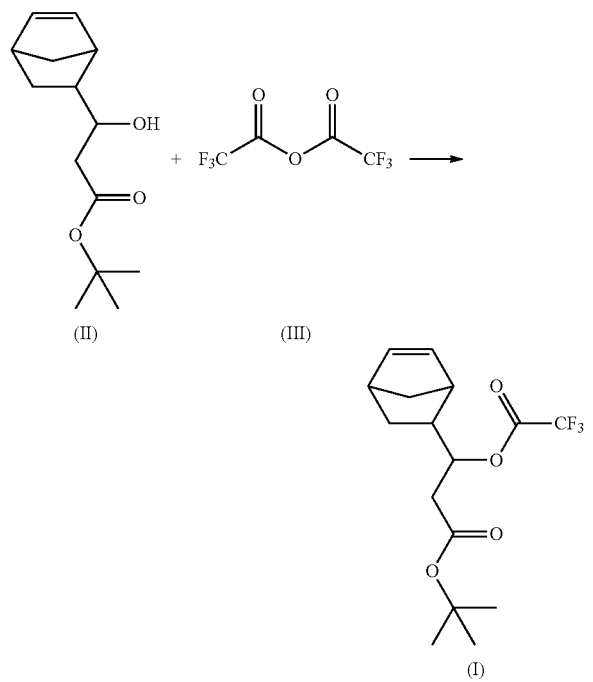

To a solution prepared by dissolving 100 g of 3-(bicyclo[2.2.1]hept-5-en-2-yl)-(3-hydroxy)propionic acid tert-butyl ester (BHP), 105.75 g of trifluoroacetic anhydride, and 4.67 g of dimethylpyridin-4-ylamine in 1 L of methylene chloride, 46.71 g of triethylamine was slowly added dropwise at 0° C., and the mixture was stirred for 3 hours at normal temperature. A reaction product thus obtained was dissolved in 500 ml of methylene chloride, and then was washed with acid and distilled water. Only the organic layer was separated. The solvent in the separated organic layer was removed, and thereby 130 g of BHP-5 as n intermediate product (compound (I)) was obtained.

$^1$H-NMR: δ (ppm) 0.6 (d, 1H), 0.82 (d, 1H), 1.25 (m, 1H), 1.42 (m, 1H), 1.58 (s 1H), 1.7 (m, 1H), 1.9 (m, 1H), 2.08 (m, 12H), 2.15~2.6 (m, 3H) 2.88 (m, 2H), 4.7 (m, 1H), 5.15 (m, 1H), 5.25 (m, 1H), 5.9 (s, 1H), 6.22 (s, 1H)

Synthesis Example for Polymer 1

30 g of the monomer for polymerization, BHP-5, produced in Synthesis Example for monomer 1, and 1.65 g of dimethyl azobisisobutyrate as a polymerization initiator were introduced together with 58.2 g of 1,4-dioxane into a flask, and then the compounds were mixed. The interior of the flask was purged with nitrogen by using nitrogen gas, and then the temperature inside the flask was increased to 75° C. When the temperature inside the flask increased to 75° C., a solution prepared by dissolving 8.8 g of maleic anhydride in 58.2 g of 1,4-dioxane was slowly added dropwise into the flask over 2 hours by using a syringe pump. A reaction was carried out for 5 hours at the same temperature to complete polymerization, and the temperature of the reaction solution thus obtained was cooled to room temperature. The reaction solution thus cooled to room temperature was precipitated by using an excess amount of methanol, and then the precipitate was filtered. At the time of filtration, the precipitate was washed with the same solvent, and then was dried under reduced pressure. Thus, 20 g of a polymer (IV) having the following structural formula was obtained. The weight average molecular weight (Mw) of this polymer as calculated relative to polystyrene standards was 3,260 g/mol, and the ratio of the weight average molecular weight and the number average molecular weight, Mw/Mn, was 1.38.

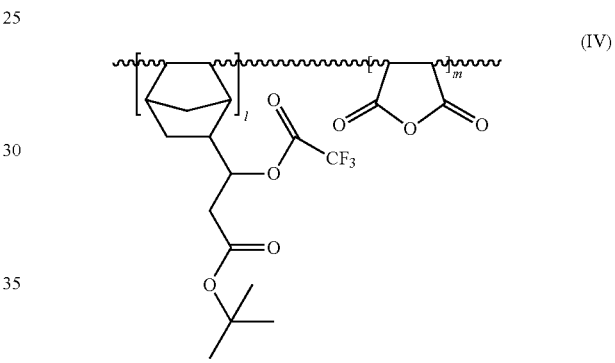

Synthesis Example for polymer 2

30 g of norborene as a monomer for polymerization, and 6.45 g of dimethyl azobisisobutyrate as a polymerization initiator were introduced together with 58.2 g of 1,4-dioxane into a flask, and then the compounds were mixed. The interior of the flask was purged with nitrogen by using nitrogen gas, and then the temperature inside the flask was increased to 75° C. When the temperature inside the flask increased to 75° C., a solution prepared by dissolving 18.75 g of maleic anhydride and 42.46 g of 1,1,1,3,3,3-hexafluoroisopropyl acrylate in 138.88 g of 1,4-dioxane was slowly added dropwise into the flask over 2 hours by using a syringe pump. A reaction was carried out for 5 hours at the same temperature to complete polymerization, and the temperature of the reaction solution thus obtained was cooled to room temperature. The reaction solution thus cooled to room temperature was precipitated by using an excess amount of methanol, and then the precipitate was filtered. At the time of filtration, the precipitate was washed with the same solvent, and then was dried under reduced pressure. Thus, 20 g of a polymer (V) having the following structural formula was obtained. The weight average molecular weight (Mw) of this polymer as calculated relative to polystyrene standards was 3,260 g/mol, and the ratio of the weight average molecular weight and the number average molecular weight, Mw/Mn, was 1.38.

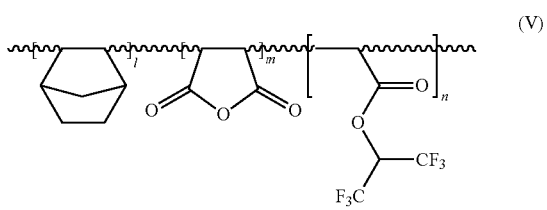

Synthesis Example for Polymer 3

30 g of the monomer for polymerization, BHP-5, produced in Synthesis Example for monomer 1 as described above and 2.48 g of dimethyl azobisisobutyrate as a polymerization initiator were introduced together with 80 g of 1,4-dioxane into a flask, and then the compounds were mixed. The interior of the flask was purged with nitrogen by using nitrogen gas, and then the temperature inside the flask was increased to 75° C. When the temperature inside the flask increased to 75° C., a solution prepared by dissolving 8.8 g of maleic anhydride and 14.01 g of γ-butyrolactyl methacrylate in 80 g of 1,4-dioxane was slowly added dropwise into the flask over 2 hours by using a syringe pump. A reaction was carried out for 5 hours at the same temperature to complete polymerization, and the temperature of the reaction solution thus obtained was cooled to room temperature. The reaction solution thus cooled to room temperature was precipitated by using an excess amount of methanol, and then the precipitate was filtered. At the time of filtration, the precipitate was washed with the same solvent, and then was dried under reduced pressure. Thus, 42 g of a polymer (VI) having the following structural formula was obtained. The weight average molecular weight (Mw) of this polymer as calculated relative to polystyrene standards was 4,300 g/mol, and the ratio of the weight average molecular weight and the number average molecular weight, Mw/Mn, was 1.45.

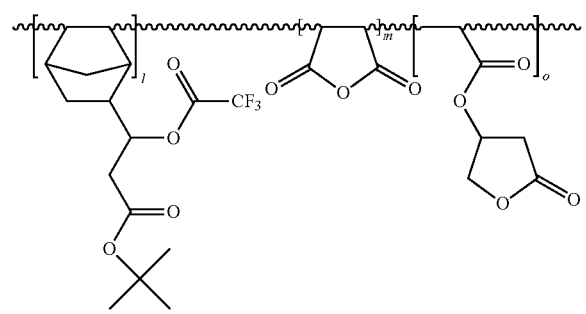

Synthesis Example for Polymer 4

8.45 g of norborene as a monomer for polymerization and 3.30 g of dimethyl azobisisobutyrate as a polymerization initiator were introduced together with 76.89 g of 1,4-dioxane into a flask, and then the compounds were mixed. The interior of the flask was purged with nitrogen by using nitrogen gas, and then the temperature inside the flask was increased to 75° C. When the temperature inside the flask increased to 75° C., a solution prepared by dissolving 8.8 g of maleic anhydride, 20 g of 1,1,1,3,3,3-hexafluoroisopropyl acrylate, and 14.01 g of γ-butyrolactyl methacrylate in 76.89 g of 1,4-dioxane was slowly added dropwise into the flask over 2 hours by using a syringe pump. A reaction was carried out for 5 hours at the same temperature to complete polymerization, and the temperature of the reaction solution thus obtained was cooled to room temperature. The reaction solution thus cooled to room temperature was precipitated by using an excess amount of methanol, and then the precipitate was filtered. At the time of filtration, the precipitate was washed with the same solvent, and then was dried under reduced pressure. Thus, 37 g of a polymer (VII) having the following structural formula was obtained. The weight average molecular weight (Mw) of this polymer as calculated relative to polystyrene standards was 4,200 g/mol, and the ratio of the weight average molecular weight and the number average molecular weight, Mw/Mn, was 1.54.

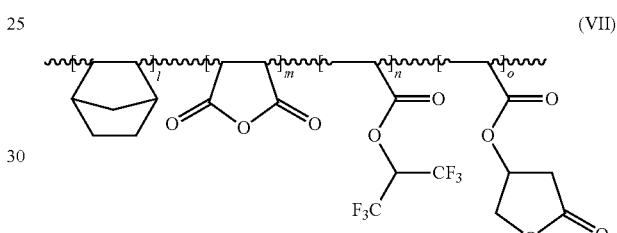

Synthesis Example for Polymer 5

20 g of 3-bicyclo[2,2,1]hept-5-en-2-yl-3-hydroxypropionic acid t-butyl ester (BHP) and 1.93 g of dimethyl azobisisobutyrate as a polymerization initiator were introduced together with 35.79 g of 1,4-dioxane into a flask, and then the compounds were mixed. The interior of the flask was purged with nitrogen by using nitrogen gas, and then the temperature inside the flask was increased to 75° C. When the temperature inside the flask increased to 75° C., a solution prepared by dissolving 9.24 g of methyladamantane methacrylate and 6.55 g of α-butyrolactyl methacrylate in 35.79 g of 1,4-dioxane was slowly added dropwise into the flask over 2 hours by using a syringe pump. A reaction was carried out for 5 hours at the same temperature to complete polymerization, and the temperature of the reaction solution thus obtained was cooled to room temperature. The reaction solution thus cooled to room temperature was precipitated by using an excess amount of methanol, and then the precipitate was filtered. At the time of filtration, the precipitate was washed with the same solvent, and then was dried under reduced pressure. Thus, 19 g of a polymer (VIII) having the following structural formula was obtained. The weight average molecular weight (Mw) of this polymer as calculated relative to polystyrene standards was 6,231 g/mol, and the ratio of the weight average molecular weight and the number average molecular weight, Mw/Mn, was 1.92.

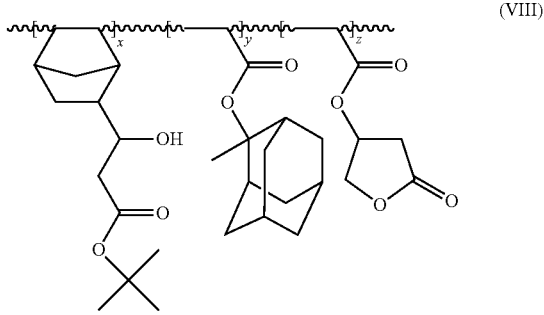

(VIII)

Experiment Example

Formation of Resist Film and Analysis of Characteristic of Resist Film Produced

Example and Comparative Example

As the additive for a resist composition, 1.0 g of each of the polymers synthesized in Synthesis Examples for polymer 1 to 5 was dissolved together with 5 g of a base polymer for resist represented by the following formula (27) (Mw: 8,500 g/mol, Mw/Mn: 1.75, molar ratio of the respective repeating units (x:y:z:w) was 1:1:1:1) and 0.31 g of a photoacid generator represented by the following formula (28) in 80 g of propylene glycol monoethyl ether acetate (PGMEA), and then the solution was filtered through a polypropylene filter having a pore size of 0.2 μm. Thus, resist compositions (Examples 1 to 4, and Comparative Example 1) were prepared.

[Chemical Formula 27]

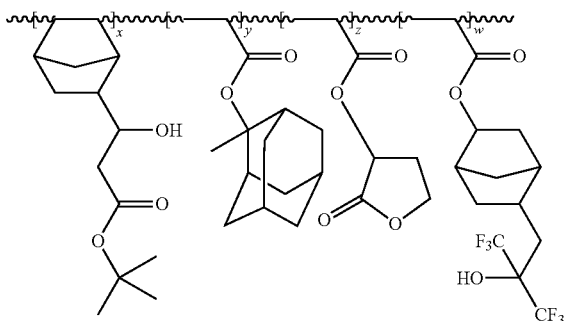

[Chemical Formula 28]

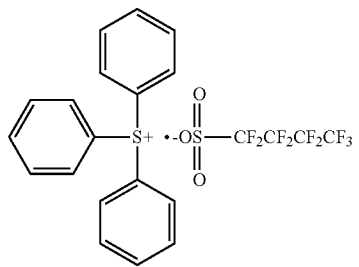

On a silicon substrate, an anti-reflection film (BARC) having a thickness of 90 nm was formed, and the resist composition prepared as described above was applied on the substrate where the anti-reflection film had been formed. Subsequently, the substrate was baked for 60 seconds at 100° C., and thus a resist film having a thickness of 120 nm was formed.

The sliding angles and the receding contact angles of the resist films thus formed were respectively measured.

More specifically, the substrate having the resist film formed thereon was maintained horizontally, and 50 μl of pure water was added dropwise thereon to form water droplets. Subsequently, the silicon substrate was slowly inclined, and the angle of the silicon substrate at which the water droplets started to slide (sliding angle) and the receding contact angle were measured. The results are presented in the following Table 1.

Subsequently, in order to reproduce immersion exposure, the resist film after exposure was rinsed with pure water for 5 minutes. That is, exposure was carried out with an ArF scanner 306C (NA=0.78, 6% halftone mask) manufactured by Nikon Corp., and rinsing was carried out for 5 minutes while adding pure water. After an exposure for 60 seconds at 110° C., PEB was carried out, and development was carried out with a 2.38 wt % TMAH developing solution for 60 seconds.

The silicon substrate thus produced was cut, and the sensitivity was evaluated. At this time, the amount of exposure by which resolution of 65-nm L/S at 1:1 can be achieved was designated as sensitivity.

TABLE 1

| Resist composition | Additive for resist | Sliding angle (°) | Receding contact angle (°) | Sensitivity (mJ/cm$^2$) |
|---|---|---|---|---|
| Example 1 | Polymer 1 (IV) | 89 | 78 | 34 |
| Example 2 | Polymer 2 (V) | 87 | 76 | 34 |
| Example 3 | Polymer 3 (VI) | 82 | 73 | 33 |
| Example 4 | Polymer 4 (VII) | 82 | 72 | 33 |
| Comparative Example 1 | Polymer 5 (VIII) | 75 | 65 | No pattern formed |

According to the results described in Table 1, the resist films formed by using the resist compositions of Examples 1 to 4 that contained the copolymer as the additive for resist according to the present invention, exhibited larger sliding angles and larger receding contact angles as compared with the resist film formed by using the resist composition of Comparative Example 1 that contained the polymer 5 (VIII) as the additive for resist.

From these results, it can be seen that the resist films produced with the resist compositions of Examples 1 to 4 have sufficient hydrophobicity, and the formation of a protective film against the resist film at the time of immersion exposure is unnecessary. Furthermore, the resist films formed by using the resist compositions of Examples 1 to 4 exhibited improved excellent sensitivity characteristics t the time of immersion exposure, while in the case of the resist composition of Comparative Example 1, pattern formation was not achieved, so that sensitivity measurement could not be performed.

Thus, preferred embodiments of the present invention have been described in detail, but the scope of the present invention is not intended to be limited thereto, and various modifications and improvements made by those having ordinary skill in the art by using the fundamental concept of the present invention are also included in the scope of the present invention.

What is claimed is:

1. An additive for resist represented by the following formula (1):

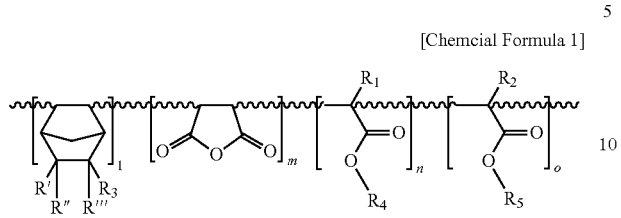

[Chemical Formula 1]

wherein R', R" and R''' are each independently selected from the group consisting of a hydrogen atom, a C1-C4 alkyl group, a halogen group, and a C1-C4 haloalkyl group in which one hydrogen atom is substituted with a halogen group;

$R_1$ and $R_2$ are each independently a hydrogen atom or a C1-C8 alkyl group;

$R_3$ is represented by following Formula (3):

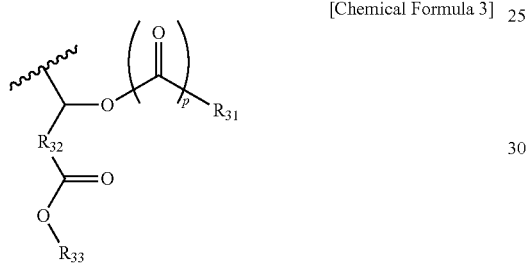

[Chemical Formula 3]

wherein in the formula (3), $R_{31}$ represents a hydrophobic group of a C1-C20 haloalkyl group;

$R_{32}$ represents a group selected from the group consisting of a C1-C20 alkanediyl group, a C2-C20 alkenediyl group, a C1-C20 heteroalkanediyl group, a C2-C20 heteroalkenediyl group, a C3-C30 cycloalkenediyl group, a C3-C30 cycloalkenediyl group, a C2-C30 heterocycloalkanediyl group, and a C3-C30 heterocycloalkenediyl group;

$R_{33}$ represents an acid-labile group that may be selected from the group consisting of

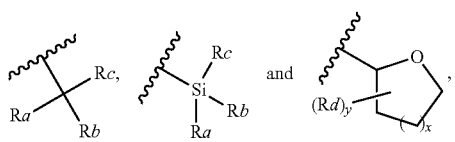

wherein Ra, Rb, Rc and Rd independently represent a group selected from the group consisting of a C1-C10 alkyl group, a C3-C14 monocyclic cycloalkyl group, a C8-C20 bicyclic cycloalkyl group, a C10-C30 tricyclic cycloalkyl group, a C10-C30 tetracyclic cycloalkyl group, a (C1-C5 alkyl)cycloalkyl group, a hydroxyalkyl group, a C1-C10 alkoxy group, a (C1-C5 alkoxy)alkyl group, an acetyl group, an acetylalkyl group, a carboxyl group, a (C1-C5 alkyl)carboxyl group, and a (C3-C10 cycloalkyl)carboxyl group, or adjacent groups may be bonded to each other to form a saturated or unsaturated C6-C18 hydrocarbon ring or a C5-C18 heterocyclic group; x represents an integer from 0 to 3; and y represents an integer from 0 to 5, with the proviso that $R_{33}$ is not a group of formula (4b)

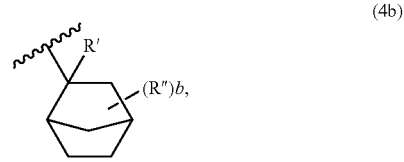

wherein R' and R" each independently represent a hydrogen atom or a C1-C10 alkyl group, and b is an integer from 0 to 15, $R_4$ is a C3-C20 hydrocarbon group or an organosilicon group;

$R_5$ represents a lactone group selected from the group consisting of

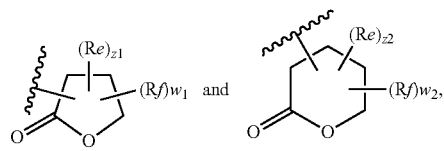

wherein Re and Rf each independently represent a C1-C10 alkyl group or may be bonded to each other to form a saturated C3-C30 hydrocarbon ring; z1 and w1 each independently represent an integer from 0 to 3; z2 and w2 each independently represent an integer from 0 to 7; $0 \leq z1+w1 \leq 5$; and $0 \leq z2+w2 \leq 5$;

l, m, n and o respectively represent the proportions of corresponding repeating units in the main chain, such that $l+m+n+o=1$, while $0<l/(l+m+n+o)<0.9$, $0.2<m/(l+m+n+o)<0.9$, $0<n/(l+m+n+o)<0.9$, and $0 \leq o/(l+m+n+o) <0.9$; and p represents an integer of 1.

2. The additive for resist according to claim 1, wherein $R_{31}$ is selected from the group consisting of a C1-C10 fluoroalkyl group.

3. The additive for resist according to claim 1, wherein $R_{31}$ is selected from the group consisting of a trifluoromethyl group, a di(trifluoromethyl)isopropyl group, a pentafluoroethyl group, and a heptafluoropropyl group.

4. The additive for resist according to claim 1, wherein $R_{33}$ is selected from the group consisting of a t-butyl group, and groups represented by the following formulas (4a), (4c) to (4h), (4j) and (4k):

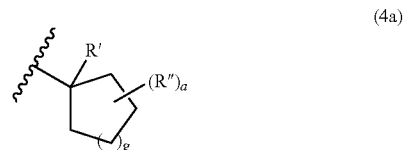

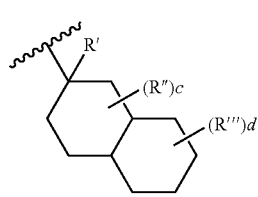

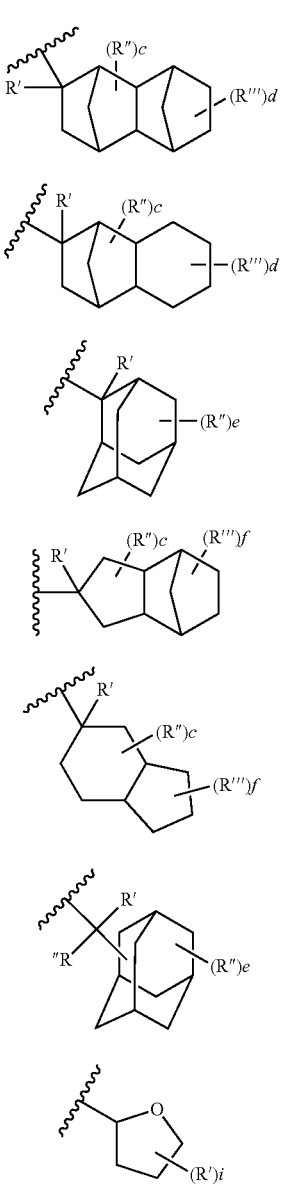

wherein in the formulas (4a), (4c) to (4h), (4j), and (4k), R', R" and R"' each independently represent a hydrogen atom or a C1-C10 alkyl group; a and e each represent an integer from 0 to 15; b represents an integer from 0 to 11; c and d each independently represent an integer from 0 to 9; f represents an integer from 0 to 7; g and i each independently represent an integer from 0 to 6; h represents an integer from 0 to 4; 0≤c+d≤17; and 0≤c+f≤15.

5. The additive for resist according to claim 1, wherein n is a positive integer and $R_4$ is selected from the group consisting of a silyl group, a C1-C10 alkylsilyl group, a chain-like or branched C3-C10 alkyl group, C3-C14 monocyclic cycloalkyl group, a C8-C18 bicyclic cycloalkyl group, a C10-C20 tricyclic cycloalkyl group, and a C10-C20 tetracyclic cycloalkyl group.

6. The additive for resist according to claim 1, wherein n is a positive integer and $R_4$ is a t-butyl group or a trimethylsilyl group.

7. The additive for resist according to claim 1, wherein in the formula (1), the repeating unit m is included in the copolymer of the additive for resist in an amount of 30% to 60% by mole.

8. The additive for resist according to claim 1, having a weight average molecular weight as measured by gel permeation chromatography and calculated relative to polystyrene standards, of 1,000 g/mol to 50,000 g/mol.

9. The additive for resist according to claim 1, wherein the ratio of the weight average molecular weight and the number average molecular weight of the additive for resist is 1 to 5.

10. A resist composition comprising the additive for resist according to claim 1, a base polymer for resist, an acid generator, and a solvent.

11. The resist composition according to claim 10, wherein the additive for resist is incorporated in an amount of 0.05% to 5% by weight relative to the total weight of the resist composition.

12. The resist composition according to claim 10, wherein the acid generator is one or more compounds selected from the group consisting of compounds represented by the following formulas (22) and (23):

[Chemical Formula 22]

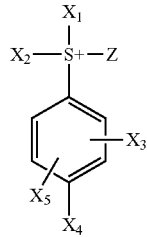

[Chemical Formula 23]

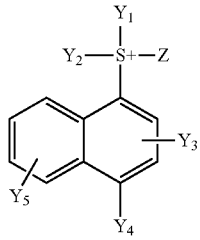

wherein in the formulas (22) and (23), wherein $X_1$, $X_2$, $Y_1$, and $Y_2$ are each independently selected from the group consisting of a hydrogen atom, a C1-C10 alkyl group, an allyl group, a perfluoroalkyl group, a benzyl group, a C6-C30 aryl group, and any combination thereof, wherein $X_1$ and $X_2$ are fused to form a C3-C30 saturated or unsaturated hydrocarbon ring, and $Y_1$ and $Y_2$ are fused to form a C3-C30 saturated or unsaturated hydrocarbon ring, $X_3$, $X_4$, $X_5$, $Y_3$, $Y_4$, and $Y_5$ are each independently selected from the group consisting of a hydrogen atom, a C1-C30 alkyl group, a halogen group, a C1-C30 alkoxy group, a C6-C30 aryl group, a thiophenoxy group, a C1-C30 thioalkoxy group, a C1-C20 alkoxycarbonylmethoxy group, and any combination thereof, Z, which denotes an anion, is $OSO_2CF_3$, $OSO_2C_4F_9$, $OSO_2C_8F_{17}$, $N(CF_3)_2$, $N(C_2F_5)_2$, $N(C_4F_9)_2$, $C(CF_3)_3$, $C(C_2F_5)_3$, $C(C_4F_9)_3$, or a functional group represented by the following formula (24):

[Chemical Formula 24]

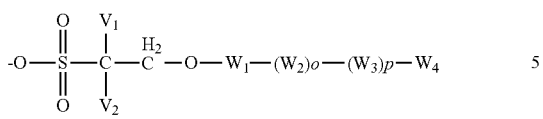

wherein in the formula (24), wherein $V_1$ and $V_2$ are each independently a halogen atom, $W_1$ is —(C=O)— or —($SO_2$)—, $W_2$ is a C1-C10 alkanediyl group, $W_3$ is selected from the group consisting of a C3-C30 cycloalkyl group, a C6-C30 aryl group, a C7-C30 aralkyl group, a C6-C30 aryloxy group, a C6-C30 arylthio group, and a C5-C30 heterocyclic group, $W_4$ is selected from the group consisting of a hydrogen atom, a halogen group, a C1-C10 alkyl group, a C1-C10 alkoxy group, a C1-C10 haloalkyl group, a C1-C10 alkylthio group, a C6-C30 aryl group, and any combination thereof, o is an integer of 0 to 1, and p is an integer of 0 to 2.

13. The resist composition according to claim 10, wherein the acid generator is incorporated into the resist composition in an amount of 0.3 parts to 10 parts by weight relative to 100 parts of the total solids content in the resist composition.

14. The resist composition according to claim 10, further comprising an additive selected from the group consisting of an alkali dissolution suppressing agent, an acid diffusion suppressing agent, a surfactant, and mixtures thereof.

15. A method for forming a resist pattern, the method comprising: applying the resist composition according to claim 10 on a substrate and thereby forming a resist film; heat treating the resist film, and then exposing the resist film in a predetermined pattern; and developing the exposed resist pattern.

16. The method for forming a resist pattern according to claim 15, wherein the exposure is carried out by using a light source selected from the group consisting of a KrF excimer laser, an ArF excimer laser, an extreme ultraviolet radiation, X-radiation, and an electron beam.

17. An additive for resist represented by the following formula (1)

[Chemical formula 1]

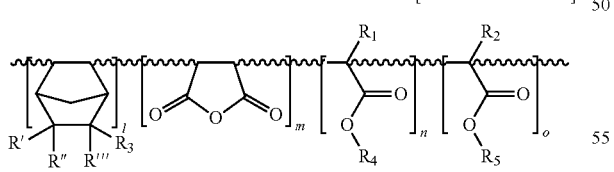

wherein R', R" and R'" are each independently selected from the group consisting of a hydrogen atom, a C1-C4 alkyl group, a halogen group, and a C1-C4 haloalkyl group in which one hydrogen atom is substituted with a halogen group;

$R_1$ and $R_2$ are each independently a hydrogen atom or a C1-C8 alkyl group;

$R_3$ is a hydrogen atom or a functional group represented by following Formula (3):

[Chemical formula 3]

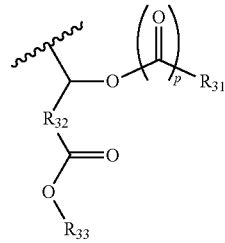

wherein in the formula (3), $R_{31}$ represents a hydrophobic group of a C1-C20 haloalkyl group;

$R_{32}$ represents a group selected from the group consisting of a C1-C20 alkanediyl group, a C2-C20 alkenediyl group, a C1-C20 heteroalkanediyl group, a C2-C20 heteroalkenediyl group, a C3-C30 cycloalkenediyl group, a C3-C30 cycloalkenediyl group, a C2-C30 heterocycloalkanediyl group, and a C3-C30 heterocycloalkenediyl group;

$R_{33}$ represents an acid-labile group selected from the group consisting of

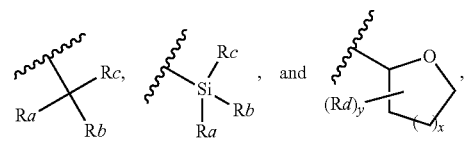

wherein Ra, Rb, Rc and Rd each independently represent a group selected from the group consisting of a C1-C20 alkyl group, a C3-C30 cycloalkyl group, a (C1-C10 alkyl)cycloalkyl group, a hydroxyalkyl group; a C1-C20 alkoxy group, a (C1-C10 alkoxy)alkyl group, an acetyl group, an acetylalkyl group, a carboxyl group, a (C1-C10 alkyl)carboxyl group, a (C3-C18 cycloalkyl)carboxyl group, and a C3-C30 heterocycloalkyl group, or adjacent groups may be bonded to each other to form a C3-C30 saturated or unsaturated hydrocarbon ring or a C2-C30 heterocyclic group;

x represents an integer from 0 to 3;

y represents an integer from 0 to 10;

$R_4$ is selected from the group consisting of a C1-C20 haloalkyl group, an organosilicon group, and a C3-C20 hydrocarbon group, provided that when $R_3$ is a hydrogen atom, $R_4$ is a C1-C20 haloalkyl group, and when $R_3$ represents the functional group represented by formula (3), $R_4$ is a C3-C20 hydrocarbon group or an organosilicon group;

$R_5$ is selected from the group consisting of groups represented by the following formulas (6l) and (6m):

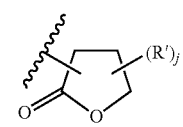

(6l)

(6m)

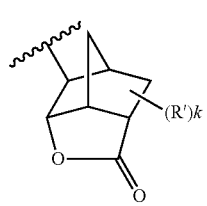

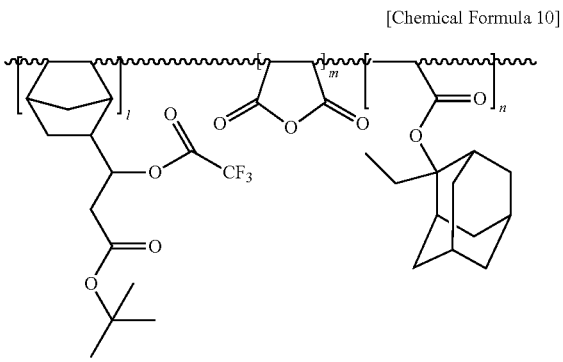
[Chemical Formula 10]

wherein in the formula (6l) and (6m), R' represents a hydrogen atom or a C1-C10 alkyl group; represents an integer from 0 to 6; j represents an integer from 0 to 4;

l, m, n and o respectively represent the proportions of corresponding repeating units in the main chain, such that $l+m+n+o=1$, while $0<l/(l+m+n+o)<0.9$, $0.2<m/(l+m+n+o)<0.9$, $0\leq n/(l+m+n+o)<0.9$, and $0<o/(l+m+n+o)<0.9$, provided that when $R_3$ represents a hydrogen atom, n is not 0; o represents a positive integer, and p represents an integer of 1.

18. An additive for resist selected from the group consisting of compounds having structures represented by the following formulas (7) to (10), (15), (17) and (18):

[Chemical Formula 7]

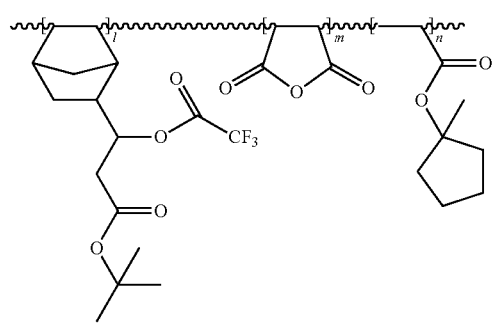

[Chemical Formula 15]

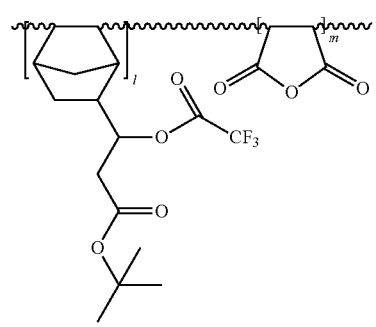

[Chemical Formula 8]

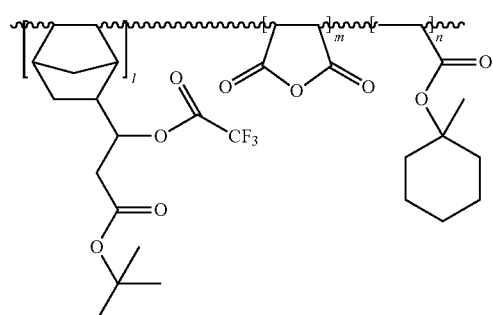

[Chemical Formula 17]

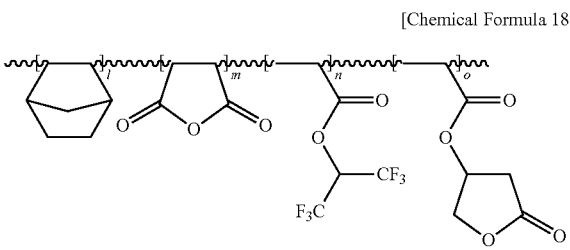

[Chemical Formula 9]

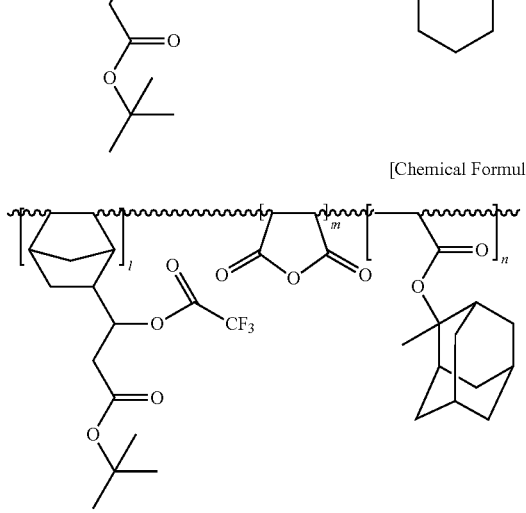

[Chemical Formula 18]

wherein in the formulas (7) to (10), (15), (17) and (18), l, m, n and o respectively represent the proportions of corresponding repeating units in the main chain, such that $l+m+n+o=1$, while $0<l/(l+m+n+o)<0.9$, $0.2<m/(l+m+n+o)<0.9$, $0<n/(l+m+n+o)<0.9$, and $0<o/(l+m+n+o)<0.9$.

* * * * *